(12) United States Patent
Bagchi et al.

(10) Patent No.: US 10,007,592 B2
(45) Date of Patent: Jun. 26, 2018

(54) DEBUGGING NON-DETERMINISTIC EMBEDDED SYSTEMS

(71) Applicant: Purdue Research Foundation, West Lafayette, IN (US)

(72) Inventors: Saurabh Bagchi, West Lafayette, IN (US); Matthew Edward Tan Creti, Lafayette, IN (US); Vinaitheerthan Sundaram, West Lafayette, IN (US); Patrick Eugster, West Layfayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 16 days.

(21) Appl. No.: 15/031,230

(22) PCT Filed: Oct. 3, 2014

(86) PCT No.: PCT/US2014/058999
§ 371 (c)(1),
(2) Date: Apr. 21, 2016

(87) PCT Pub. No.: WO2015/061022
PCT Pub. Date: Apr. 30, 2015

(65) Prior Publication Data
US 2016/0314055 A1   Oct. 27, 2016

Related U.S. Application Data

(60) Provisional application No. 61/893,923, filed on Oct. 22, 2013.

(51) Int. Cl.
*G06F 11/00* (2006.01)
*G06F 11/36* (2006.01)
(Continued)

(52) U.S. Cl.
CPC ........ *G06F 11/366* (2013.01); *G06F 9/30098* (2013.01); *G06F 9/3865* (2013.01);
(Continued)

(58) Field of Classification Search
CPC .... G06F 11/366; G06F 11/362; G06F 11/364; G06F 11/3612; G06F 11/3636;
(Continued)

(56) References Cited

U.S. PATENT DOCUMENTS 7,043,668 B1   5/2006   Treue et al.
7,178,133 B1   2/2007   Thekkath
(Continued)

FOREIGN PATENT DOCUMENTS

WO   WO2010/002489   1/2010

OTHER PUBLICATIONS

Choudhuri, S. et al., "FlashBox: A System for Logging Non-Deterministic Events in Deployed Embedded Systems", SAC, Mar. 8-12, 2009, 7 pages.
(Continued)

*Primary Examiner* — Joseph D Manoskey
(74) *Attorney, Agent, or Firm* — Lee & Hayes, PLLC; Christopher J. White

(57) ABSTRACT

An embedded device includes a processor executing instructions from module(s) in a code memory. The instructions specify: reading data from two non-deterministic registers (NDRs) of different types, compressing the data using respective, different compression algorithms, and storing the compressed data in a nonvolatile medium. A method of enabling debug tracing in a computer program product (CPP) includes locating instructions in the CPP that read NDRs, determining types of the NDRs, and adding instruction(s) to the CPP to compress the values read using compression algorithms corresponding to the respective NDR
(Continued)

types. An emulator in a computer-readable medium receives emulation-target instructions (ETIs) and compressed NDR data, and emulates an execution sequence of the ETIs by determining NDR-reading instructions, determining a type of the NDR read by each, decompressing a portion of the NDR data using a type-specific decompressor, and updating emulated-machine state based on the decompressed portion.

19 Claims, 10 Drawing Sheets

(51) Int. Cl.
  *G06F 9/30* (2018.01)
  *G06F 9/38* (2018.01)
  *H03M 7/30* (2006.01)
(52) U.S. Cl.
  CPC .......... *G06F 11/362* (2013.01); *G06F 11/364* (2013.01); *H03M 7/60* (2013.01)
(58) Field of Classification Search
  CPC ............. G06F 11/3656; G06F 9/30098; G06F 9/3865; H03M 7/60
  See application file for complete search history.

(56) References Cited

U.S. PATENT DOCUMENTS

| | | | |
|---|---|---|---|
| 7,181,728 B1 | 2/2007 | Thekkath | |
| 7,185,234 B1 | 2/2007 | Thekkath | |
| 7,412,630 B2 | 8/2008 | Thekkath | |
| 7,644,319 B2 | 1/2010 | Thekkath | |
| 7,770,156 B2 | 8/2010 | Thekkath | |
| 8,185,879 B2 | 5/2012 | Thekkath et al. | |
| 2007/0180327 A1 | 8/2007 | Thekkath | |
| 2007/0180333 A1 | 8/2007 | Thekkath et al. | |
| 2008/0086730 A1* | 4/2008 | Vertes ................. | G06F 11/1438 718/100 |
| 2009/0037704 A1 | 2/2009 | Thekkath | |
| 2009/0282294 A1* | 11/2009 | Edwards ............. | G06F 11/3636 714/45 |
| 2009/0313460 A1 | 12/2009 | Huang et al. | |
| 2010/0251031 A1 | 9/2010 | Nieh et al. | |
| 2011/0047360 A1* | 2/2011 | Maloney ............. | G06F 9/30043 712/225 |
| 2012/0011491 A1 | 1/2012 | Eldar | |

OTHER PUBLICATIONS

Dunlap, G.W., et al., "Execution Replay for Multiprocessor Virtual Machines", VEE, Mar. 5-7, 2008, 10 pages.

Erikssen, J., et al., "Demo Abstract: Accurate Power Profiling of Sensomets with the COOJA/MSPsim Simulator", IEEE, Nov. 2009, 3 pages.
Geels, D., et al., "Friday: Global Comprehension for Distributed Replay", NSDI 2007, 14 pages.
Geels, D., et al., "Replay Debugging for Distributed Applications", USENIX Annual Technical Conference, 2006, 12 pages.
Georges, A., et al., JaRec: A Portable Record/Replay Environment for Multi-Threaded Java Applications, Software-Practice and Experience, 2004, vol. 34, pp. 523-547.
Guo, Z., et al., "R2: An Application-Level Kernel for Record and Replay", 8th USENIX Symposium on Operating Systems Design and Implementation, 16 pages.
Huang, J., et al., "LEAP: The Lightweigh Deterministic Multi-Processor Replay of Concurrent Java Programs", FSE-18, Nov. 7-11, 2010, 10 pages.
Leblanc, T.J., et al., Debugging Parallel Programs with Instrant Replay, IEEE Transactions on Computers, vol. C-36, No. 4, Apr. 1987, pp. 471-482.
Sundaram, V., et al., "Efficient Diagnostic Tracing for Wireless Sensor Networks", SenSys, Nov. 3-5, 2010, 14 pages.
Sundaram, V., et al., "Prius: Generic Hybrid Trace Compression for Wireless Sensor Networks", SenSys, Nov. 6-9, 2012, 14 pages.
Tancreti, M., et al., "Aveksha: A Hardware-Software Approach for Non-Intrusive Tracing and Profiling of Wireless Embedded Systems", SenSys, Nov. 1-4, 2011, 14 pages.
Thane, H., et al., "Using Deterministic Replay for Debugging of Distributed Real-Time Systems", Proceedings—Euromicro conference on Real-Time Systems, Jan. 2000, 8 pages.
Wang, M., et al., "Dependence-Based Multi-Level Tracing and Replay for Wireless Sensor Networks Debugging", LCTES, Apr. 11-14, 2011, 10 pages.
Williams, "An Extremely Fast ZIV-Lempel Data Compression Algorithm", in the Proceedings of the 1991 IEEE Data Compression Conference, Apr. 1991, pp. 362-371.
Wu, M., et al., Language-Based Replay Via Data Flow Cut, FSE-18, Nov. 7-11, 2010, 10 pages.
Yang, J., et al., "Clairvoyant: A Comprehensive Source-Level Debugger for Wireless Sensor Networks", SenSys '07, Nov. 6-9, 2007, 16 pages.
Ziv, J., et al., "A Universal Algorithm for Sequential Data Compression", IEEE Transactions on Information Theory, vol. IT-23, No. 3, May 1977, pp. 337-343.
Ronsse, M., et al., "RecPlay: A Fully Integrated Practical Record/Replay System", ACM Transactions on Computer Systems, vol. 17, No. 2, May 1999, pp. 133-152.
PCT Search Report and Written Opinion dated Jan. 9, 2015 for PCT application No. PCT/US2014/058999, 14 pages.

\* cited by examiner

```
if ( call SFD.get() )
```

```
if ( *(volatile uint8_t *)28 &
     (0x01<<1) )
```
with brace 222 over the whole expression and brace 224 under `(0x01<<1)`.

```
D.103 = MEM[(volatile uint8_t *)28];   ← 222
D.104 = D.103 & 2;                     ← 224
if (D.104 != 0)                        ← 232
```

```
D.441 = MEM[(volatile uint8_t *)28];   ← 222
D.103 = tardis_rle_record(
            D.441,    ← 242 / 252
            28,       ← 254
            2,        ← 224
            41)       ← 258
D.104 = D.103 & 2;    ← 224
if (D.104 != 0)       ← 232
```

DEBUGGING NON-DETERMINISTIC EMBEDDED SYSTEMS

CROSS-REFERENCE TO RELATED APPLICATIONS

This application is a 35 USC § 371 filing of International Application No. PCT/US2014/058999, filed Oct. 3, 2014, and entitled "Debugging Non-Deterministic Embedded Systems," which claims priority to and the benefit of U.S. Provisional Patent Application Ser. No. 61/893,923, filed Oct. 22, 2013, and entitled "System-Level Record and Replay in Wireless Sensor Networks," the entirety of which is incorporated herein by reference.

STATEMENT REGARDING FEDERALLY SPONSORED RESEARCH OR DEVELOPMENT

This invention was made with government support under CNS-0834529 and ECCS-0925851 awarded by the National Science Foundation. The government has certain rights in the invention.

TECHNICAL FIELD

The present disclosure generally relates to software-trace and software-replay systems, and in particular to such systems used in debugging tools for embedded computing devices.

BACKGROUND

Networks of computing devices are used in many applications. One such example is a wireless sensor network (WSN) that includes a large number of nodes that are in remote communication with a base station. These nodes communicate data with the base station, on a regular or irregular basis. In either case, the data can be communicated with deterministic or non-deterministic timing. In the event the network behaves in a manner that is unexpected, e.g., when a bug occurs, determining the source of the bug can be challenging due to, e.g., remoteness of deployed sensor nodes (e.g., inaccessibility), the non-deterministic nature of data or of a sequence of execution that can make it challenging to replicate the bug, or the limited hardware resources available on a node.

A mechanism for debugging such networks is known as "record and replay," which logs a trace of predefined events while an application is executing such that the events can be replayed later using associated debugging tools. However, these debugging tools have various limitations. For example, existing recording methods for WSNs for several reasons cannot capture complete code execution associated with the nodes, thus resulting in the inability to effectively replay and thereby causing some bugs to go unnoticed. For example, prior deterministic record and replay methods cannot adequately trace non-deterministic events such as sensor values or message arrival times, and do not execute efficiently on limited-resource computing nodes.

BRIEF DESCRIPTION

According to an aspect, there is provided an embedded device comprising: a processor; a nonvolatile computer storage medium; a code memory; and one or more module(s) stored in the code memory and configured for execution by the processor, the one or more module(s) including instructions to: read data from a first non-deterministic register (NDR) of a first type; read data from a second, different NDR of a second, different type; compress the data from the first NDR using a first compression algorithm to provide first compressed data; compress the data from the second NDR using a second, different compression algorithm to provide second compressed data; and store the first and second compressed data in the nonvolatile medium.

According to another aspect, there is provided a method of enabling debug tracing in a computer program product, the computer program product comprising instructions for use within an architecture of an embedded device, the method including: locating one(s) of the instructions that read an NDR, the locating being performed using register data of the architecture; determining a register type of the NDR using the register data; adding instruction(s) to the computer program product following the located instruction(s), the added instruction(s) including instruction(s) for use within the architecture to compress the value read by the located instruction(s) using a compression algorithm corresponding to the determined register type; and repeating the locating, determining, and adding steps for each of a plurality of located one(s) of the instructions of the computer program product using compression algorithms corresponding to the respective determined register types.

According to yet another aspect, there is provided a computer program product comprising a computer readable medium and an emulator computer program mechanism embedded therein, the emulator computer program mechanism comprising instructions for: receiving emulation-target instructions and compressed data of NDR values, wherein the emulation-target instructions include first instructions to read NDRs and second instructions; emulating an execution sequence of the emulation-target instructions, the emulating including: for each second instruction in the execution sequence, updating an emulated-machine state based on that second instruction; and for each first instruction in the execution sequence: determining a type of the NDR read by the first instruction; decompressing a portion of the compressed data using a decompression algorithm corresponding to the determined register type; and updating the emulated-machine state based on the decompressed portion.

Various aspects advantageously permit tracing of longer, broader traces than prior schemes. Various aspects advantageously permit debugging a wider range of bugs than do prior schemes.

BRIEF DESCRIPTION OF THE DRAWINGS

The above and other objects, features, and advantages of the present application will become more apparent when taken in conjunction with the following description and drawings wherein identical reference numerals have been used, where possible, to designate identical features that are common to the figures, and wherein.

Figure 1A:
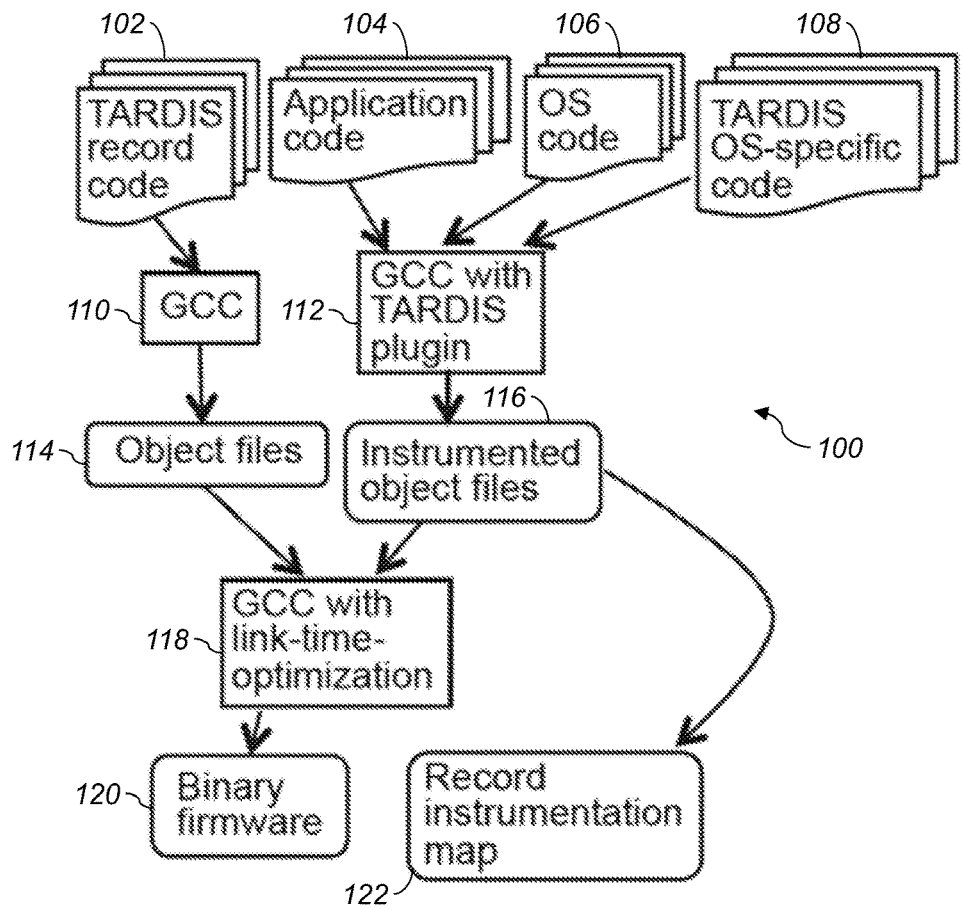
FIG. 1A is a flow diagram of exemplary processes of preparing binary firmware and a record instrumentation map.

The attached drawings are for purposes of illustration and are not necessarily to scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the description below, some aspects will be described in terms that would ordinarily be implemented as software programs. Those skilled in the art will readily recognize that the equivalent of such software can also be constructed in hardware, firmware, or micro-code. Because data manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts. Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

"Non-determinism" and similar terms refer to influences on the behavior of a computing device that are outside the control of that computing device or processor(s) therein. For example, sensor values are non-deterministic (from the viewpoint of the software on a computing device), since their values are not known or determinable from any characteristics of the software. Values read on I/O ports or addresses (in systems using memory-mapped I/O) are non-deterministic. Accordingly, the behavior of a computing device in response to non-deterministic values is also non-deterministic.

There is a need for a novel real-time debugging system capable of recording and replaying data associated with nodes in a network of plurality of nodes, where such nodes execute software using non-deterministic data. There is a need for ways of replaying the chain of events leading up to a software failure so bugs can be located and fixed.

Prior work used custom field-programmable gate arrays (FPGAs) to assist record and reply replay. Various aspects herein advantageously use software running on stock processors and do not require hardware changes to nodes under test. In various aspects, record and replay can be performed without the support of a virtualization environment such as VMware. Various aspects advantageously permit recreating the same memory state during debugging as existed at runtime, enabling software testers or developers to use a much wider range of debugging tools than do prior schemes.

In the present disclosure a trace and replay debugging system for, e.g., sensor nets or other networks of embedded devices, or other computing devices (hereinafter referred to as TARDIS) is presented. TARDIS is configured for record and re-play of data associated with nodes in a network, e.g., wireless sensor network (WSN) nodes. The system described herein is applicable to a broad area of resource constrained embedded systems. TARDIS may be configured to record substantially all sources of non-determinism, and can compress data that is to be recorded using domain-specific compression techniques.

Debugging is often performed in a cyclic process of repeatedly executing a program and tracking down bugs. In WSNs, cyclic debugging can be a time consuming and laborious task. Programmers of WSNs often use tools such as simulators, safe code enforcement, and formal testing prior to deployment of the application in the field. However, the reality is that exhaustive testing of all or even substantially all conditions in a pre-deployment setting, e.g., in a laboratory, may not be feasible because WSNs are typically deployed in throughput-challenged environments whose behavior cannot be easily duplicated in a laboratory. When a bug manifests itself in a deployed WSN, detecting and diagnosing the bug can thus be a daunting task. Nodes are often not easily physically accessible, meaning that the programmer must rely on low-power wireless links to collect any data of interest. There may not be sufficient information available to immediately diagnose a bug, so the network must be wirelessly reprogrammed to collect additional debugging data. This iterative process can be time consuming. Once a bug fix is applied, the network is again wirelessly reprogrammed, and further monitoring is required to determine that the bug has been successfully fixed. The cyclic debugging approach of fix and test becomes particularly laborious in this environment.

Record and replay can make the process of cyclic debugging less tedious. Record and replay is a debugging technique where program execution is recorded in real-time and then reproduced off-line. Record and replay cuts down on the cyclic process of debugging by capturing a program's execution such that it can be deterministically reproduced and carefully examined off-line, for identifying a bug. It is a particularly valuable technique for WSNs, because the recording can happen on the nodes and the replay and debugging can happen on the relatively resource rich desktop-class machines, e.g., at a base station. The typical workflow for record and replay in WSNs is that during normal execution of a deployed WSN, the nodes execute instrumented binaries that record a trace of all sources of non-determinism to Flash. The trace can then be brought back to the lab for offline replay. This can be done either through wireless data collection or by physically accessing a node. In the lab, the recorded data is fed into an emulator, which replays the node's execution. The replay allows a developer to examine the program's execution, including its interactions with the environment, at various arbitrary levels of detail, such as through setting breakpoints or querying the state of memory. Such replay helps the developer identify the root cause of bugs encountered in the field.

The main processor and non-volatile storage are often heavily constrained in WSNs, in order to reduce cost, size, and energy consumption of individual nodes. The main processor is typically a microcontroller (processor) which may be limited to a few MHz clock speed, and random access memory (RAM) in the range of tens of kilobytes. Non-volatile storage is usually a Flash chip which may contain anywhere from MB to a few GB of storage. In one exemplary embodiment, a WSN sensor node has 1 MB of Flash and 2 GB SD card for storage. However, trace data rates of 5.4 MB per minute are typical in some WSN type applications. Additionally, storing data to Flash is energy intensive, with frequent Flash usage reducing a node's battery lifetime by, e.g., a factor of 3.

Moreover, WSNs often have soft real-time constraints. Adding instrumentation to record non-deterministic events can interfere with the timing of the main application and associated tasks causing excessive delays in the allotted cycles. In an example, each sensing cycle of a node in a WSN is only allotted 2 s.

WSNs often do not have a clear separation between application and system software. Some WSN nodes operate without an operating system (in a "bare-metal" configuration). For example, there is typically no hardware memory protection on most low-end processors, and prominent WSN operating systems (OSes), e.g., open-source OSes designed for low-power wireless devices, such sensor networks, personal area networks, smart buildings and smart meters. As a result, logging only application events can be insufficient in some systems, since the application can affect the behavior or functioning of the operating system. This contributes to a need in some systems to also log operating-system events in a trace, which increases the memory required for the trace. It can be desirable to record the complete execution of a sensor node's processor for replay, rather than only application components. This record and replay is referred to as system-level, which is more resource intensive than application-level record and replay.

In WSNs, it is sometimes impracticable to record every instruction (due to resource and real-time constraints). Some aspects of the present disclosure are directed to determining what data are relevant to be replayed. According to one exemplary embodiment, non-deterministic data is recorded for replay. It should be noted that there are many sources of non-deterministic behavior. In one exemplary embodiment, a processor 886, FIG. 8, configured to read a sensor 823, FIG. 8, has 16 interrupt vectors and 367 peripheral registers. Thus, non-deterministic events such as which interrupt is triggered at which points in the application code, when the interrupts are detected, and values of the registers are non-deterministic data that can be recorded to permit tracing execution. As used herein, the term "register" is not restricted to on-CPU static-RAM registers tied with the machine language of the CPU. The term "register" encompasses any memory location or cell that can be read by a CPU or other processor(s) in a computing device under control of computer program instructions executing on such processor(s). Examples of registers include CPU registers, RAM locations, and I/O ports, whether port-mapped or memory-mapped.

According to various aspects, registers are classified by type of non-determinism and compressed in a type-specific manner. For example, one type of NDR is a peripheral register. Peripheral registers are registers present on the processor, but whose contents are controlled from sources external to the processor. For example, the value read from a register containing the value of an on-chip analog-to-digital (ADC) converter is non-deterministic. The number of bits that are needed to be stored can be determined by observing certain relationships; for example, a 10-bit ADC has 10 bits of non-determinism, despite the register being 16 bits in size.

Various exemplary compression schemes herein are designed to be lightweight in their use of compute resources. In various aspects, the compression is done in an opportunistic manner, e.g., whenever there is idle time on the processor. This can reduce the probability of violating an application's timing requirements. By using different compression schemes in an integrated manner in one system, an effective solution is presented for record and replay in a WSN.

Figure 1B:
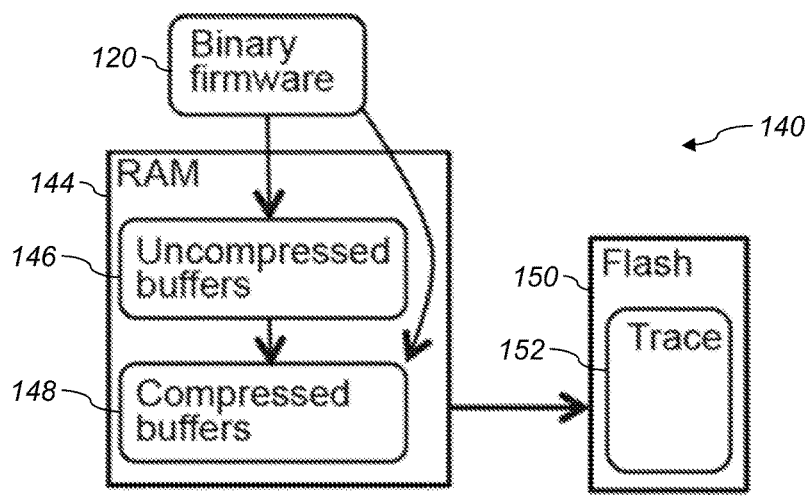
FIG. 1B is a flow diagram of exemplary processes of tracing execution of a binary firmware program.
Figures 1C, 2A, 2B, 2C, 2D:
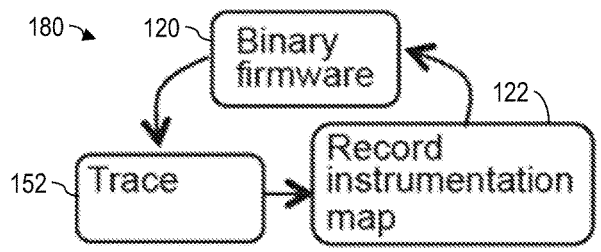
FIG. 1C is a flow diagram of exemplary processes of replaying execution of a binary firmware program.
FIGS. 2A-2D show computer program listings of successive steps of processing of code to read an NDR according to various aspects.

TARDIS, in various aspects herein, can be used in situ to record deployed sensor nodes. An exemplary overall operational flow 100 is shown in FIGS. 1A-1C, which depicts three phases: compile-time (FIG. 1A), run-time (FIG. 1B), and off-line replay (FIG. 1C). FIGS. 1A-1C also provides internal details of each phase, which are explained in greater detail below. Once an application program is available, the application program can be pre-compiled (e.g., in a source-to-source transform) to add instrumentation. One or more (up to all) NDR reads and interrupt handlers can be instrumented. The instrumented source can be compiled, installed, or deployed as for the non-instrumented application program. When the instrumented application program executes, the instrumentation code stores trace values. To replay, trace data are loaded into an emulator. Conventional emulators use randomization techniques to provide values for NDRs or interrupts. Various inventive emulators herein pull those values from the trace.

FIG. 1A shows an exemplary first phase. A compiler 112, e.g., GCC with a TARDIS plugin, is used to compile one or more of application code 104, operating-system code 106, and TARDIS OS-specific code 105 into object files 116, which therefore include TARDIS instrumentation. In various aspects, for a given embedded system, an architecture is defined. The architecture identifies sources of non-determinism and which bits are non-deterministic. Accordingly, the specific assignments of compression algorithms to NDRs or interrupts can vary by processor or circuit board.

Non-application-specific code, e.g., data compression code and other TARDIS recording code 102, are compiled by compiler 112 or compiler 110, e.g., vanilla GCC, into object files 114. A linker 118, e.g., GCC or ld, combines object files 114, 116 to provide binary firmware 120 which will execute on the sensor node, and which includes TARDIS instrumentation for recording. An instrumentation map 122 is provided using instrumented object files 116, e.g., by extracting read IDs 258 from the parameter lists of calls to TARDIS routines, or other ways discussed herein.

FIG. 1B shows an exemplary second phase. The node executes binary firmware 120, e.g., in situ in the normal operating environment of the node, and logs a checkpoint and a trace 152 of its execution to Flash memory 150 or another nonvolatile memory. In at least one example, when the Flash is full, a new checkpoint is taken and the oldest data is overwritten first. To log trace 152, the firmware 120 can store data in RAM 144 in uncompressed buffers 146 or in compressed buffers 148. The firmware 120 can also compress data in uncompressed buffers 146 to provide compressed buffers 148. Compressed buffers 148 can then be written to trace 152.

In various examples, binary firmware 120 includes program instructions to detect when non-time-critical tasks are running and store data in Flash at such times. In an example, the program instructions schedule Flash data storage when an OS event queue or runnable-task queue is empty. In some examples, Flash data storage tasks can take priority over other tasks; in other examples, Flash data storage tasks have the lowest priority (other than the idle task). In some examples, the program instructions cause data to be stored in Flash when the processor would otherwise be going to sleep. Before the processor sleeps, the trace data are compressed and stored in Flash, in these examples. In some examples, Flash storage is handled by an OS task. This permits Flash storage to be interrupted by higher-priority tasks that carry out the normal operation of the system, and then resume once those higher-priority tasks complete.

Various aspects advantageously do not require support from a specific OS, so can be readily ported. TARDIS OS-specific code 108 in various tested examples is small and easy to port. Various aspects of TARDIS have been implemented on both TinyOS and Contiki operating systems.

FIG. 1C shows an exemplary third phase that can be executed in an emulator 180. The third phase can be a replay, e.g., on a laboratory computer or other computer running emulator 180, e.g., a desktop-class machine with more resources than a node. During execution of the application (binary firmware 120) on the emulator 180, the trace 152 of non-deterministic data is used to deterministically reproduce the node's execution, as discussed below.

Eight exemplary domains of non-determinism in a WSN are identified herein. These eight domains relate to specific approaches of compressing various types of non-deterministic events. The approaches discussed herein provide flexibility for a general-purpose software-only record and replay implementation for WSNs resulting in an 85-96% smaller trace size compared to the state-of-the-art control flow record and replay technique. The exemplary domains are in two major categories: reads from NDRs, and interrupts. For each category or domain, compression techniques are selected to record as few bits as possible for each such read or interrupt.

In a hypothetical example of a typical WSN application, a node takes a series of sensor readings every 20 seconds and forwards the associated data to a base station.

Examples of non-deterministic events that can be recorded to support deterministic replay include reads from peripheral registers and interrupts. Regarding reads, the processor can include peripheral registers that can be read by the processor, but whose values are set from external sources. For example, a processor can have a peripheral register designated to contain a data value of a most recent reading taken by an ADC. Regarding interrupts, the interrupt vector and the timing of the interrupt (e.g., at which instruction in the instruction stream was the interrupt signaled or did the interrupt service routine, ISR, begin execution) are both non-deterministic.

As stated above, the rate of non-deterministic data can be large. In one exemplary application, for one minute of real-time data acquisition, 5.4 MB of trace data may need to be recorded, which includes data recorded in every peripheral register and the timing of every interrupt. One source of non-deterministic data is a timer interrupt that takes place 64 times per second. This ISR for this interrupt starts by reading a register that indicates the purpose of the interrupt, and then it reads the current time from a timer register to check if any tasks are scheduled to be executed. In total, each call to the timer interrupt service handler requires logging several reads from NDRs. Moreover, even though the timing of the timer interrupt is known, different instructions can be interrupted each time the timer interrupt fires. Accordingly, data regarding the occurrence of the timer interrupt itself is non-deterministic. Another example is related to a radio. Even if a radio send rate is low, e.g., only every 20 seconds, the node can perform frequent tasks such as checking for radio messages being broadcast. The radio is normally off to save energy and is turned on several times a second to perform a clear channel assessment. Data read from the radio to perform that assessment are non-deterministic.

A trace of the size of 5.4 MB exceeds the RAM capacity of some embedded computers. Accordingly, such a trace can be stored in Flash memory. Flash is a significant consumer of energy, e.g., the Flash on an exemplary node draws a current of 15 mA during write. As a point of comparison, a sleeping node draws on the order of a few µA. Moreover, transmitting a large trace wirelessly to a base station can consume significant energy. Various aspects herein enable record and replay for WSNs by compressing the trace data without interfering with the real-time constraints of the system.

One exemplary type of NDR is a state register such as a peripheral register including a plurality of bitfields in a single processor word. Accordingly, register masking is a common programming pattern. Take for example the case of the interrupt flag register, where each bit represents a different condition. It is common to test one specific condition, so a mask is bitwise ANDed with the register. In the following exemplary line of C code, a mask (TXFLG) is applied to test if the transmit flag is set in the interrupt flag register (IFG):

not_done_transmitting=IFG & TXFLG;

During replay of this line of code, an emulator will need to consult the recorded trace, because IFG is a non-deterministic peripheral register. However, it may be observed that in the case where a mask is applied, it is sufficient for deterministic replay to only know the value of the unmasked bits and not the entire value of the register. This can lead to a significant saving because a 16-bit register read can be potentially stored in a single bit (e.g., if TXFLG has only a single '1' bit). Various aspects check for the masked register pattern at compile time and instrument recording of peripheral register reads, accordingly, e.g., as discussed below with reference to FIGS. 2A-2D. This compression can be performed even when other non-deterministic bits are present in the register, e.g., UART status since compression can be performed per-read rather than per-register.

State registers can also be used in polling loops. An example of a polling loop is where the processor transmits a byte to the serial peripheral interface (SPI) bus, then it stays in a loop until the transmit complete flag is set, before transmitting the next byte. In the following exemplary line of C code, IFG is the interrupt flag register and TXFLG=1 is a mask for the least significant bit that is cleared when the byte has finished transmission:

while (IFG & TXFLG) /* do nothing */;

This loop will read from the register IFG multiple times before the byte has finished being transmitted. A correct execution exits the polling loop. Infinite loops (e.g., due to hardware failures) can be terminated, e.g., by a watchdog timer. Moreover, the exemplary loop itself, like similar polling loops, does not modify global or local memory. Therefore, in various aspects, replay skips beyond the loop without losing the property of deterministic replay. There is however one consequence of skipping the loop, and that is losing the cycle accuracy of the replay. In some examples, the time to transmit a byte is predictable, e.g., because the SPI bus peripheral module typically uses a multiple of the same clock signal as the processor, and thus can be accounted for by the replay emulator. In some examples, a loop count (discussed below) is not incremented during polling loops that do not read or modify any data that is live after the polling loop exits.

A peripheral module register may exhibit a strong temporal locality. For example, a flag bit that indicates whether an overflow has occurred in a timer may usually be set to zero, because the overflow case is less common. Another example is with interrupt vector registers that indicate the purpose for an interrupt being signaled. A timer register may be signaled due to the timer reaching one of six capture/compare values. In a typical application, one of the capture/compare registers may be more frequently used than the others, resulting in the interrupt vector register often repeating the same value. For many application programs, most reads to registers reporting the status of a particular peripheral module have the same value on consecutive reads. This can be taken advantage of by having the replayer predict that the next read from a register is the same as the last read from that register, so only reads resulting in wrong predictions need to be logged. Accordingly, 89% to 93% of peripheral register reads do not need to be logged when applying this simple form of register prediction.

Timer registers are counters that are incremented on clock edges. When a timer register either overflows or reaches the value of a capture/compare register, a timer interrupt is fired. The timer register is typically read once following the timer interrupt. It may be read more times before the processor goes to sleep. In some examples, the first read of a timer following a timer interrupt is likely to result in a value which is close to the value of the capture/compare register that caused the interrupt, or zero if the interrupt was caused by an overflow. Successive reads to the timer register are likely to result in values that are small increments from one to the next. This is because, in these examples, the processor does not spend much time in active mode. All of the reads to the timer register following an interrupt happen within a small period of time. Thus, the difference between successive timer reads can be logged rather than the value of the timer register itself. For the first timer read following a timer interrupt the difference between the timer register value and the capture/compare register value (or zero for overflow) can be logged.

Two common WSN features, sensors and radios, account for another source of non-deterministic reads. Unlike the registers discussed above, these registers are not quite as simple to predict. However, in practice, they are quite compressible due to repeated sequences. For example, radio messages contain header information that is often similar from one message to the next. Routes do not change often, so consecutive messages are likely to be addressed to the same next hop neighbor. Sensor readings often have repeating values. In a tested example, the sensor and radio data registers can be compressed by 82% for one exemplary application.

Some exemplary application programs, such as programs for WSNs, are designed to last for a long time, e.g., months to years of unassisted execution. To achieve this, sensor applications are designed to have a very low duty cycle, with the processor on a sensor node spending most of its wall-clock time in a low-power sleep mode. The processor in these examples can be woken from sleep by an interrupt. A typical application wakes the processor dozens of times per second but for only very brief bursts (<1 ms) of activity. Small tasks are performed each time the node is woken up, such as checking if radio messages are being transmitted, taking sensor readings, or updating software based clocks that are based on the underlying hardware clocks. Because the processor is active for such a short amount of time the probability of an interrupt occurring when the processor is active is small. Therefore, the vast majority of interrupts in these examples (e.g., 95%-99%) occur when the node is in sleep mode. In some examples, there is only a single location in the code where the node can enter sleep. Accordingly, in various aspects, when recording interrupts that wake the node from sleep state, the timing (e.g., where within the instruction execution stream the interrupt occurred) or address for interrupts that happen during sleep are not recorded. Many interrupts are for timer ISRs that update the clock and then quickly go back to sleep. In some examples, only the interrupt vector is recorded, and the whole sleep period is considered to be atomic. In an example of the MSP430 processor, the interrupt vector takes 4 bits, the interrupted address takes 16 bits, and the loop count (discussed below) takes 16 bits. Saving only the vector can reduce the storage requirement for tracing an interrupt from 36 bits to 4 bits.

In the architecture of one exemplary sensor node, there are 16 interrupt service handlers. These handlers are for direct memory access (DMA), input/output (I/O), watchdog, timers, universal asynchronous receiver transmitters (USARTs), comparators, ADCs, and digital to analog converters (DACs). It is common in a typical application that most interrupts are to just a few of the interrupt service handlers. For example, a main timer interrupt handler in a typical application is called often (e.g., 64 times a second), while some other interrupt handlers may be called rarely or not at all. For example, not all applications use the DAC, the ADC, both timers, DMA, the watchdog timer, and both USART buses and therefore will not see interrupts from such peripherals. Another consequence of this observation is that a simple prediction type compression can be employed, in which it is predicted that the next interrupt service handler to be invoked will be the same as the last one. In a tested example, this prediction technique is correct about 85% of the time, so only about 15% of the interrupts will need to be logged.

In various application programs, all reads from peripheral registers are statically addressed. A static access means that the register is addressed directly and not by a pointer that can vary at runtime. In such programs, reads from peripheral registers can be readily identified and instrumented at compile time. Each peripheral register has a permanently assigned function defined in the architecture. Non-static reads can be traced by, e.g., manually instrumenting the target system code.

Various aspects are designed for single processor record and replay. Various aspects provide record and replay of multi-processor architectures, including recording the order of non-deterministic operations between processors or in multi-threaded code. In various examples, the thread scheduler is a part of the system being recorded and, therefore, is deterministic.

As noted above, sources of non-deterministic data to be recorded include reads from peripheral registers and interrupts. The method of encoding or compression applied to peripheral registers depends on their functionality. For example, registers with similar functions have common behaviors that can be exploited to improve compression. Classes of register functionality include: State, Data, and Timer. State registers include interrupt vectors, interrupt flags, overflow flags, and ready flags. Data registers contain general purpose I/O and bus data such as from a radio or sensor. Timer registers are counters that are incremented on the edge of a clock source. The clock may be asynchronous to the processor's clock making its value non-deterministic. Registers can be assigned to the three classes based on the architecture, e.g., based on processor documentation and embedded-system configuration.

State registers can be encoded using run length encoding (RLE). In at least one example, the recorder software maintains a last-read value and count since last change for each State register. In various examples, register masking and polling loop optimizations are applied to State registers as explained herein.

Data registers can be compressed using a generic compression algorithm, e.g., LZRW, which is a variant of the LZ77 family of compression algorithms, or other LZW compression algorithm such as S-LZW. The advantage of LZRW is that it has a very small memory footprint, which is useful in systems that have only kilobytes of memory. LZRW can be configured to use a sliding window size of 128 bytes along with a table of size of 64 bytes for a total implementation size of 192 bytes in RAM. In various aspects, a compression technique is chosen that will be effective for the data of interest. In various aspects, different compressors are used for specific data registers based on domain knowledge of what the registers will typically hold.

In various aspects, for both data and state registers, only the relevant bits are stored. The relevant bits can be determined by pattern-matching in source code (e.g., to detect masking operations) or by liveness analysis (e.g., to locate dead bits, bits that do not affect execution after an NDR read).

Timer registers are counters that are incremented on clock edges. As discussed herein, the time between timer reads is often predictable. The difference (delta) between the predicted value and the actual value can be encoded using, e.g., a Golomb prefix code. A Golomb prefix code shortens the encoded length of small values, which is beneficial because the delta is often zero, or very small. Moreover, in some examples, the delta is constant, even if its magnitude is large. Near-constant values have low entropy and are thus highly compressible.

A second source of non-deterministic data that can be recorded is interrupts. To deterministically reproduce an interrupt during replay, three pieces of information must be known: the interrupt vector, the interrupt's return address, and the loop count where the interrupt happened. The interrupt's return address tells at which instruction the interrupt occurred. However, because instructions repeat, a count of the number of loop iterations for all loops is also recorded. As described above, interrupts that wake the node from sleep do not need to have their return address or loop count recorded in some examples. This is because, in these examples, there is only one location in the system code that is responsible for putting the node to sleep (e.g., the system idle task). In some aspects, the return address is compressed expecting that a few addresses in the code tend to get interrupts far more often than others. These aspects use, e.g., a 16-entry return address cache. When there is a cache hit, the 4-bit index to the cache is recorded. Only when there is no cache hit and the interrupt did not happen during sleep does the full (e.g., 16-bit return) address need to be recorded. Other sizes of cache can be used. Cache eviction policies known in the microprocessor art can be used.

In various examples, a compiler component of TARDIS can be implemented as a plugin to a compiler such as the GNU Compiler Collection (GCC). The plugin can perform a pass over the target program, instrumenting it with loop counters and code to record peripheral register reads and interrupts. A loop counter is a single counter incremented by every loop in the program. The pass can occur after most of the compiler's middle-end optimizations, but before the target program is converted to the architecture dependent Register Transfer Logic (RTL) representation. This advantageously permits inserting loop counters after completion of loop optimizations, because some optimizations change the number or structure of loops in the final binary. This also permits using architecture-independent tracing code. The representation on which an exemplary plugin operates is called Gimple, which is a simple architecture independent intermediate representation language. Other compilers or representation languages can be used.

An exemplary compilation process is shown in FIG. 1. OSes are typically monolithic in the sense that OS and application code are compiled together to generate a single binary. TARDIS runtime code is split into TARDIS OS-specific code 108 and TARDIS record code 102. The code 108 that is OS-specific is used to schedule tasks such as flushing buffers or compressing traces. Task management is OS dependent (in code 108). The TARDIS record code 102 contains functions that record events such as interrupts and peripheral or other NDR reads. In the example shown, the record code 102 itself is not instrumented. Instrumentation of application code 104 is implemented by inserting into application code 104 calls to routines in the record code 102. These calls can be inlined to reduce execution time at the cost of code size in a link-time-optimization pass.

FIGS. 2A-2D are listings of example pseudo code representing an NDR register read. FIGS. 2A-2D represent successive steps of TARDIS processing as described herein. In various examples, the illustrated computations or processing steps can differ according to device type and/or input type, for example, processor, programming language, or embedded hardware and associated board support package. Various aspects detect reads to peripheral module registers that are addressed statically in the code. This allows the compiler to know the address of these reads. FIGS. 2A-2D show an example of the compilation processes from one exemplary OS to instrumented Gimple code.

FIG. 2A shows exemplary code, e.g., nesC code. "SFD" is a peripheral connected to the processor. The processor will run the code after compilation of the code, and can retrieve data from the peripheral using the "SFD.get( )" call.

FIG. 2B shows corresponding C code prepared from the code in FIG. 2A using the nesC compiler. The SFD is now expressed as an access to address reference 222. In this example, the SFD is located at address 28 in the memory map of the processor. The example shows a test to see if the second bit of an IO peripheral register is set. The test uses mask 224, in this example having a value of 2.

FIG. 2C shows Gimple code provided from the C code in FIG. 2B by the GCC compiler's middle-end. Address reference 222 and mask 224 are still present, and the "if" statement from FIG. 2B has become a test 232 of temporary "D.104". Optimizations can be performed on the Gimple code.

FIG. 2D shows the output of an exemplary TARDIS pass over the code of FIG. 2C. TARDIS, in this example, uses pattern matching on the Gimple code to detect a read from a peripheral register. Pattern matching also reveals that a mask is being applied to the register. TARDIS inserts a call to the correct record function 242 based on the type of the register being read. For this particular register (register 28, indicated by address reference 222), the type is determined to be a state register, since one bit (indicating state) is tested. So RLE encoding is selected as the record function 242. TARDIS inserts code to pass record function the value 252 read from the register, the index 254 of the register (e.g., address reference 222), the mask 224, and a unique read ID 258. The read ID 258 is unique to each read in the application code 104. TARDIS also places the value 252, index 254, mask 224, and read ID 258 into an instrumentation map 122, which is used by the replay in emulator 180 (FIG. 1C) to know how each peripheral register read is encoded.

In various aspects, the trace 152 includes three streams: one stream of state and timer data, one stream of LZRW data, and one stream of interrupt data. The streams can be stored separately in trace 152. During replay, the replayer emulates execution of source, e.g., as described below with reference to FIG. 12. The machine state over the course of emulation determines which stream to pull the next data from. In various examples, every architectural feature that is deterministic on the processor is deterministic on the emulator.

A single binary firmware 120 containing the application 104, OS 106, and TARDIS code 108 is programmed into a node. The runtime code for TARDIS is mostly OS agnostic. This code consists of encoding, buffering, and Flash logging. There is a small amount of code specific to the OS being instrumented, it includes calling the TARDIS initialization and update functions. The update function performs the check for buffers that are ready to be compressed or written to Flash. The scheduling of calling the update function is OS specific. Also, the part of the code that writes to Flash depends on the specific Flash and the interface it exposes to the software stack.

An emulator 180 is instrumented to perform the replay. The emulator 180 starts from a memory checkpoint or known starting state (e.g., boot-up). Whenever a read from a peripheral module register is encountered, an instrumentation map 122 generated at compile time (FIG. 1A) is consulted to determine how the register has been encoded. Based on this information the register is decoded from the trace 152. The emulator 180 also knows the next interrupt in the trace 152. Logged interrupts include the vector of the interrupt, the program counter value for, or other address of, the interrupted instruction, and the loop counter. When the return address and loop count matches the next interrupt in the trace, the interrupt is emulated. For replay the binary firmware 120 is executed until a register read or the next interrupt in the trace 152 is encountered. Since all sources of non-determinism recorded during runtime are fed into the emulator 180, this faithfully reproduces the execution.

The effort of porting TARDIS to various architectures would involve creating a new register definition file. This file describes which registers are non-deterministic, and maps registers to their type: State, Data, and Timer. Porting TARDIS to different OSes involves modifying the OS-specific code 108 shown in FIG. 1A. This code interacts directly with the operating system's task scheduler.

FIGS. 3A-6 show experimental data. To evaluate TARDIS, both runtime and static overheads of TARDIS were measured for typical WSN applications from two exemplary OSes running on real hardware. The runtime overhead was measured by increase in energy consumption, CPU usage, and Flash storage, whereas the static overhead is measured by program binary size and RAM usage.

Domain specific compression techniques used by TARDIS can significantly reduce trace size—2.3× to 88× less Flash usage than baseline record and replay—and operate with tolerable overheads for energy (1-57%), a noteworthy metric for WSNs, as well as CPU, RAM and program memory usage. Furthermore, when compared to prior control flow record and replay technique, it has been determined that TARDIS only uses 4% to 15% of the trace size of one exemplary prior art tracing application while being able to replay an execution more effectively.

Experiments were conducted with 9 nodes arranged in a grid with a 1 m separation between two adjacent nodes and the base station at a corner of the grid. The experiments involving a single node represented an inactive network (i.e., no radio traffic). The experiments were run for three exemplary benchmarks. Two of the exemplary benchmarks were representative of applications in exemplary OSes. A third benchmark was also chosen to test more extreme WSN scenarios. In the first exemplary benchmark, each node sampled a light sensor at a rate of 1 Hz, and forwarded the measurements to a base station every 5 readings. Each node's radio was turned on all of the time. Each node's CPU was configured to sleep until woken up because either it had some task to do (e.g., read the light sensor) or it was interrupted by the radio. Low Power Listening (LPL), a Media Access Control (MAC) level protocol where the radio is turned on at a fixed interval to perform a Clear Channel Assessment (CCA), and immediately turned back off if there is no activity, was used in some tests. In an inactive network, LPL provides the most significant energy savings.

The second benchmark was an exemplary application, where every 20 seconds each node sent a message containing readings for 5 different sensor sources.

According to the third benchmark, each node sampled a sensor, e.g., an accelerometer, at a rate of 100 Hz for 1 second. At the end of the sampling period the node performed a Fast Fourier Transform (FFT) on the sampled data, sent a message over the radio including FFT output data, and then began the next sampling period. The sample rate of 100 Hz is representative of operations in, e.g., earthquake monitoring WSNs. The third benchmark was run in a single hop mode with each node sending directly to a base node.

The runtime overhead includes the amount of Flash used to store trace, and the additional energy and CPU time expended for tracing. The runtime overhead of a network of 9 nodes for all three of the benchmark applications was determined. To understand the effect of network as well as LPL, single node (inactive network) and LPL results for one benchmark application were determined. The size of the Flash in a tested node was 1 MB.

In FIGS. 3A-5B, data labeled "BM #1" corresponds to the first benchmark, "BM #2" to the second benchmark, and "BM #3" to the third benchmark. "Network" indicates the experiment was performed in a network of 9 nodes. Data labeled with a time in milliseconds (e.g., 64 ms or 512 ms) indicates LPL was employed with the given wakeup interval.

Figure 3A:
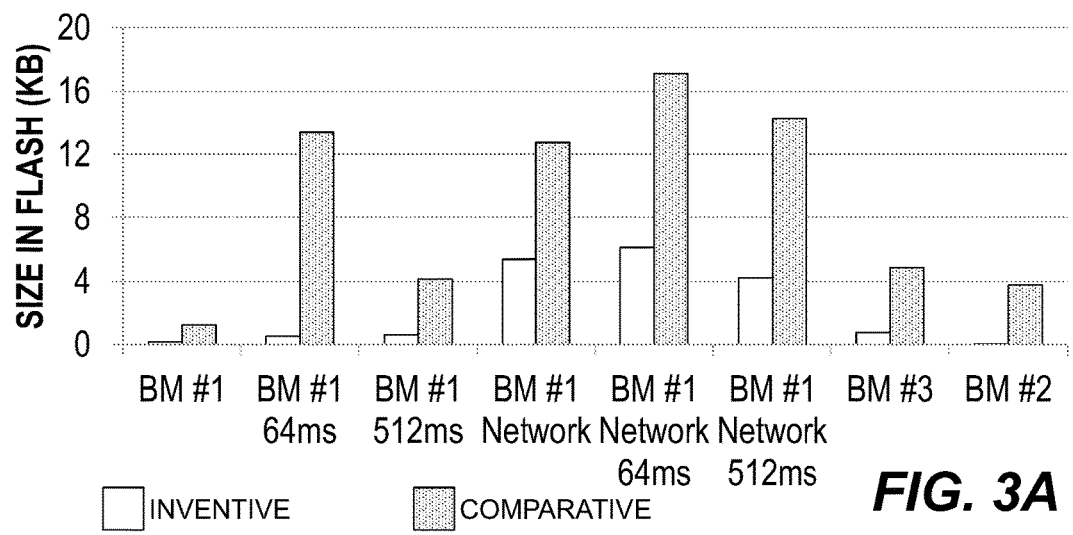
FIG. 3A shows experimental data comparing Flash-memory consumption of various comparative schemes and various inventive aspects.

FIG. 3A shows the measured size of the trace in Flash after 30 seconds of logging for various benchmarks (left bars). For comparison, the size of the uncompressed data is also shown (right, hatched bars). For the first benchmark single node, the trace sizes in baseline compared to those with TARDIS were 3.33×, 6.72×, and 25.70× larger respectively for the various cases of CPU wakeup intervals. For the network mode of the first benchmark, these ratios were 2.37×, 3.39×, and 2.62× respectively. This indicates that with a lightly loaded network there can be fewer sources of non-determinism and the non-deterministic data can be more compressible, e.g., similar kinds of interrupts recur frequently. For one exemplary benchmark, TARDIS trace size was 6.38× smaller than uncompressed. For the second benchmark (far right), the Flash utilization with TARDIS, at 1.28 KB, is too small to be visible in the figure. This gives a compression factor of 88×. Compression of the polling loops and recording the differences between subsequent timer firings contributed to this compression. The greatest rate of trace data generation with TARDIS in the experiments performed was the first benchmark in the network mode with a wakeup interval of 64 ms in which 184 KB of data is generated every 30 seconds. 50% of the Flash (i.e., 50% of 1 MB=500 KB) was filled in one tested embodiment in 1 minute 21 seconds; to be compared with the baseline case where 50% of the Flash will be utilized for logging in 35 seconds. When the Flash is 50% full, a new checkpoint is taken. By comparison, the first benchmark when the network is not active fills 50% of the Flash in 162 minutes. In various examples of a lightly loaded network, far less non-deterministic data is generated and consequently, TARDIS is more lightweight in its operation.

Figure 3B:
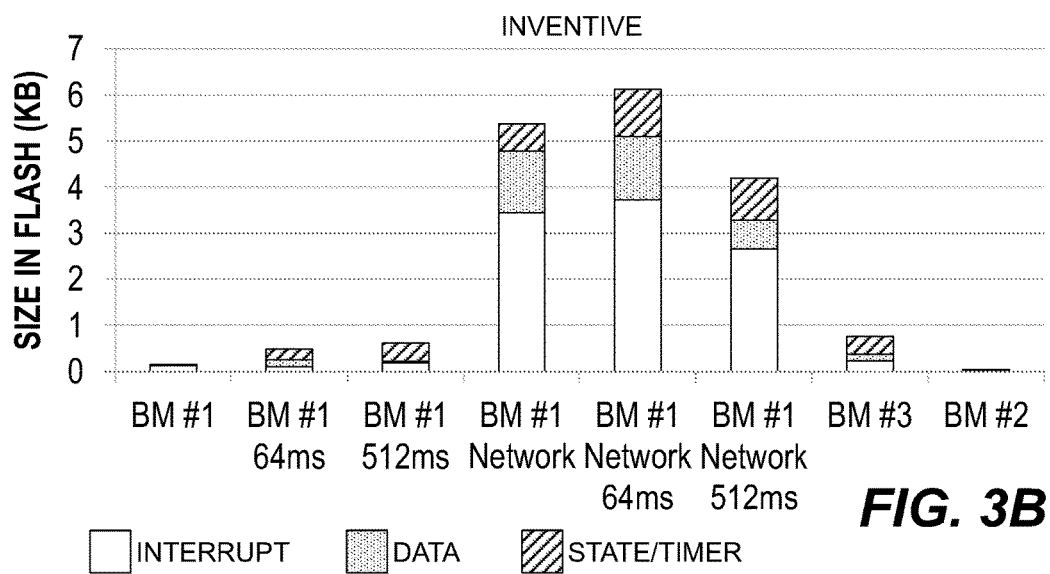
FIG. 3B shows experimental data of size in Flash of various programs according to various inventive aspects.

FIG. 3B shows experimental data of Flash utilization by type of data stored in a tested inventive example. NDR data include (i) State/Timer, which refers to the status of peripheral modules (INIT, READY, etc.) and the hardware timers, and (ii) Data, which refers to data that is read over the peripheral buses, such as, data read from sensors and radio. The most costly cases are the first benchmark with the network. In these cases logging interrupts contribute the most to the trace size. In prior art tracing cases logging interrupts contribute the most to the trace size. In the case of the first benchmark with the network there are many radio messages being received that contribute to the high number of interrupts. Furthermore, these interrupts are not very compressible because due to variability of the network effects, the messages are not received with an absolutely regular timing. For the third benchmark on the other hand, the State/Timer component dominates. In this benchmark, each node reads its ADC at 100 Hz. Thus, there are a large number of handshaking and state changes of the ADC. This is compressible in a general sense because the state changes largely follow a pattern.

Figure 4A:
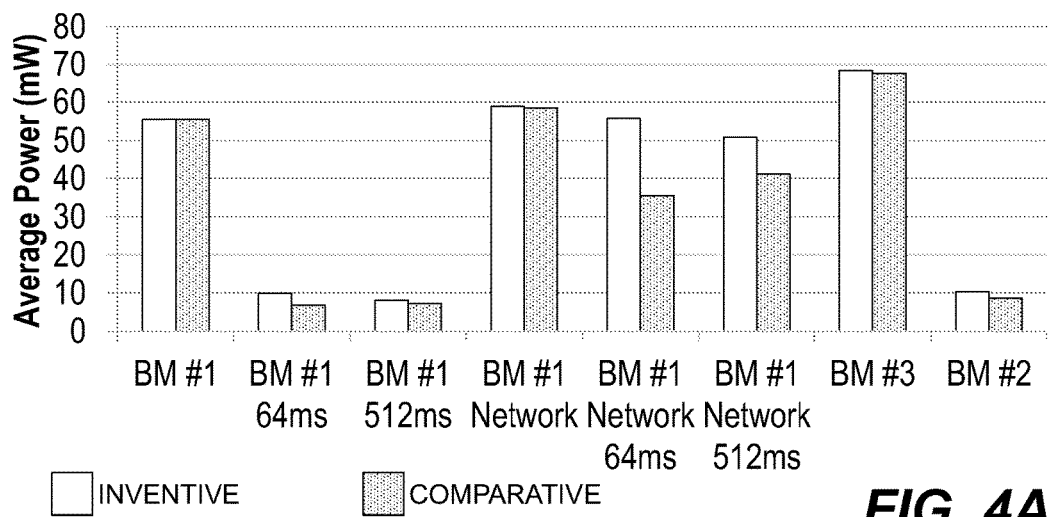
FIG. 4A shows experimental data comparing power consumption of various comparative schemes and various inventive aspects.

FIG. 4A shows the average measured power consumption of a TARDIS instrumented application and the respective unmodified application under various benchmarks. When the application is not using LPL, there is less than 1% increase in average power consumption between an unmodified application and a TARDIS instrumented application. However, when LPL is enabled, the increase in power consumption is between 13% and 57%. Programming a page (256 Bytes) into Flash consumes 45 mW but it only takes 1.5 ms. The results show that the Flash itself is not what is consuming significant power. Instead it is the time taken to record interrupts and reads, along with the time to write to the Flash, that keeps the radio active longer, and reduces the energy savings of LPL. This can be deduced from the fact that there is very little additional power consumption when the application operates with 100% duty cycle. Various aspects defer encoding and Flash write operations until the radio returns to sleep. These aspects can include buffers that can accommodate data until it is time to write the buffer contents to Flash.

Figure 4B:
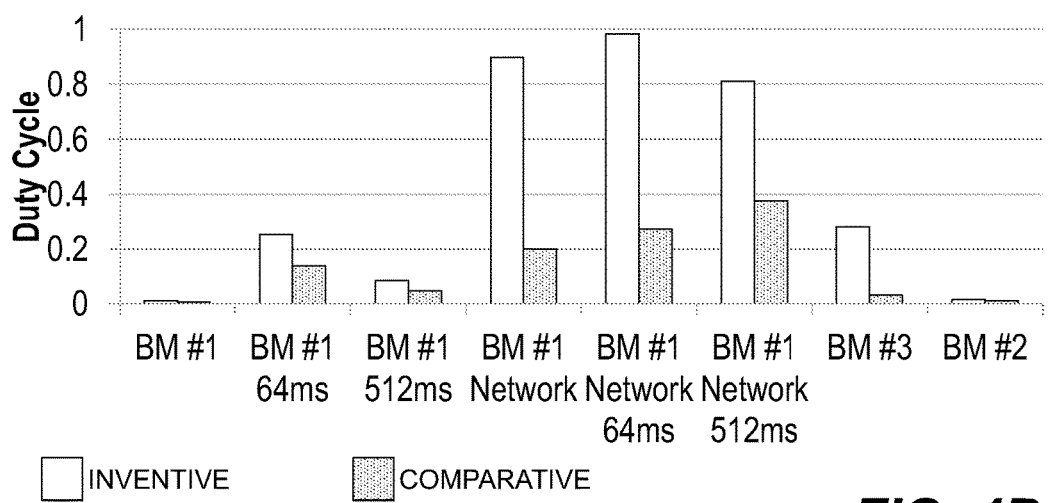
FIG. 4B shows experimental data comparing duty cycle of various comparative schemes and various inventive aspects.

FIG. 4B shows duty cycle, the fraction of time the CPU is active. The most significant increases in duty cycle due to TARDIS over the unmodified application are for the first benchmark in the network mode and for the third benchmark. In both cases, this is due to the increase in compression and logging of traces, which is caused by the large number of interrupts and radio or sensor data. In this first benchmark in the network mode, the large number of interrupts is due to heavy radio usage, whereas in the case of the third benchmark, the interrupts are due to the high sensor sample rate. In the experiments performed, the duty cycle remained below full usage of the CPU. This indicates that TARDIS can be added to existing applications.

TARDIS incurs CPU overhead only to record non-deterministic events and the first benchmark in the network mode case represents a worst case scenario where there are large numbers of non-deterministic events. In the experiments performed, the increase in energy due to the CPU is negligible when compared to energy due to other sources such as the radio.

Figure 5A:
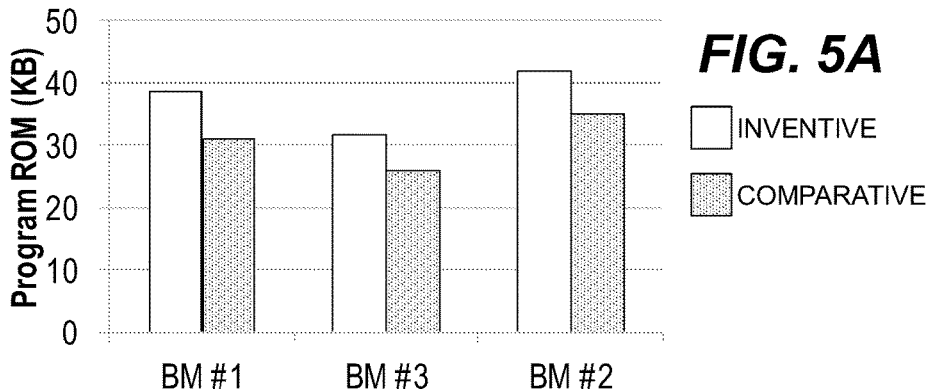
FIG. 5A shows experimental data comparing read-only memory (ROM) consumption of various comparative schemes and various inventive aspects.

FIG. 5A shows the size of binary firmware 120, FIG. 1, relative to a binary firmware without TARDIS. The program binary size is higher with TARDIS due to the TARDIS runtime system code and the instrumentation of the reads and interrupts. Note that in the exemplary WSN prior art OSes, there is a single image on the node that executes. This single image includes both the system code and the application code and thus the program binary size in the experiments performed refers to the size of this single image. However, TARDIS can also execute on OSes that separate OS and application code. Read and interrupt instrumentation includes code that performs simple encoding of the data and inserting it into a buffer. This code was inlined in the experiments to reduce execution time. All of the tested applications fit in each tested node's 48 KB of program memory.

Figure 5B:
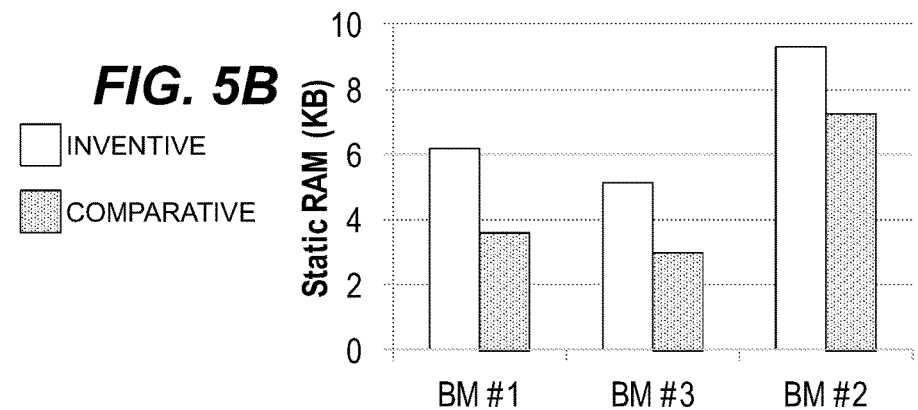
FIG. 5B shows experimental data comparing random-access memory (RAM) consumption of various comparative schemes and various inventive aspects.

FIG. 5B shows the statically allocated RAM both with and without TARDIS instrumentation. Only statically allocated RAM is shown because TARDIS in the experimental configuration tested did not use dynamically allocated RAM, and did not cause an increase of stack size during runtime. However, TARDIS can use dynamic RAM allocation or stack buffers. The increase in statically allocated RAM is due to buffers, and the internal data structures used in compression. TARDIS consumed about 2.6 KB of RAM, as tested. A tested MSP430 microprocessor had a total RAM size of 10 KB, which was able to hold TARDIS. Greater Flash usage can be traded for lesser RAM usage. If the RAM allocated to the buffers is smaller, then it will fill up quicker and more frequent logging to Flash will occur.

Figure 6:
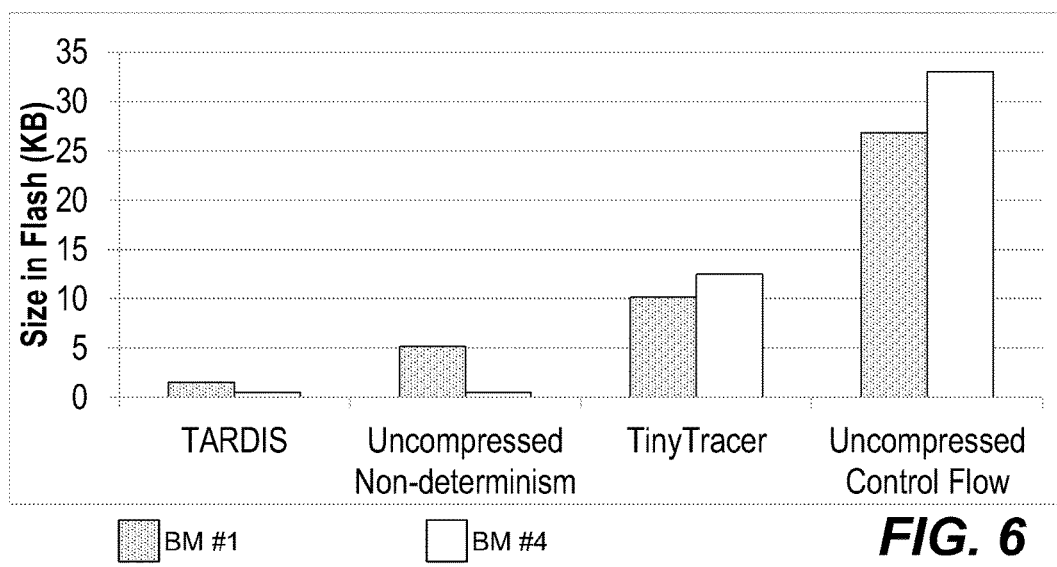
FIG. 6 shows experimental data comparing Flash-memory consumption of various tested configurations according to various inventive aspects.

FIG. 6 shows Flash size of TARDIS compared to other approaches for the first and fourth benchmarks that were tested. The fourth benchmark took no external inputs and repeatedly blinked three LEDs on the node at 1 Hz, 2 Hz, and 4 Hz.

Various aspects herein record the execution control flow without the external input data. One exemplary prior art tracer application ("TinyTracer") uses a static program analysis to encode inter- and intra-procedural control flow paths of concurrent events in a WSN application. Each benchmark application was run for 30 seconds and the results were recorded to Flash. Furthermore, for comparison reasons, uncompressed data for both TARDIS and Tiny-Tracer was also recorded.

As shown in FIG. 6, the size of trace generated by TARDIS is between 4.1% (fourth benchmark) and 15.1% (the first benchmark) of the trace size of TinyTracer. The reason for the trace size reduction in TARDIS is that TARDIS records only the non-deterministic inputs whereas TinyTracer records the effect of non-deterministic inputs, which is the cascading set of function calls triggered by non-deterministic inputs. The granularity of the exemplary prior art tracing program is the basic block and this result shows that the control flow trace when applied to the entire application is not very compressible. TARDIS not only reduces the trace size but also aids in diagnosis of many faults by reproducing the entire execution including both control and data flow. In contrast, the lack of data flow information in TinyTracer limits the number of faults that can be diagnosed.

There may be a gap of time between when a bug occurs to when it is detected by a developer. TARDIS is configured to store a long trace in time to increase the probability of being able to replay the bug.

A likely debugging scenario would be for a developer to observe increased congestion in the network, and then use TARDIS to replay execution of a node.

An exemplary application containing a known bug was executed and traced using TARDIS. The bug was in the radio module and resulted in a receiving node sending acknowledgment packets at the highest signal strength even when a lower signal strength had been specified in a parameter setting. The consequence of signaling at the highest signal strength was that it increased contention and collisions in the network thereby potentially reducing throughput. In an experiment, TARDIS traced 10.9 minutes of trace into 500 KB of Flash. In this time the tested node sent 5048 acknowledgments. In the experiment, the developer set a breakpoint during replay and examined the transmit signal strength for the acknowledgements. During replay it was observed that the signal strength value was not being correctly set.

Various aspects permit tracking causality across nodes through message sends and receives. Various aspects are useful in multi-threaded, simultaneous multi-threaded, or multi-process environments, in which additional non-determinism is introduced by different processes running concurrently in different threads or on different processors on the same computing device. For example, the order of shared memory accesses can be logged.

According to one aspect of the present disclosure, identification of registers to which non-deterministic data is written and thus used for record and replay can be automated. The peripheral registers for a type of processor are typically classified into one of three types: STATE, DATA and TIMER. The classification can be used to determine which method of compression is best suited for each of the peripheral registers on that type of processor. A table of classifications of the registers on the target processor type can be uploaded at compile time, so that reads from peripheral registers can be instrumented with a preferred compression method.

Figure 7:
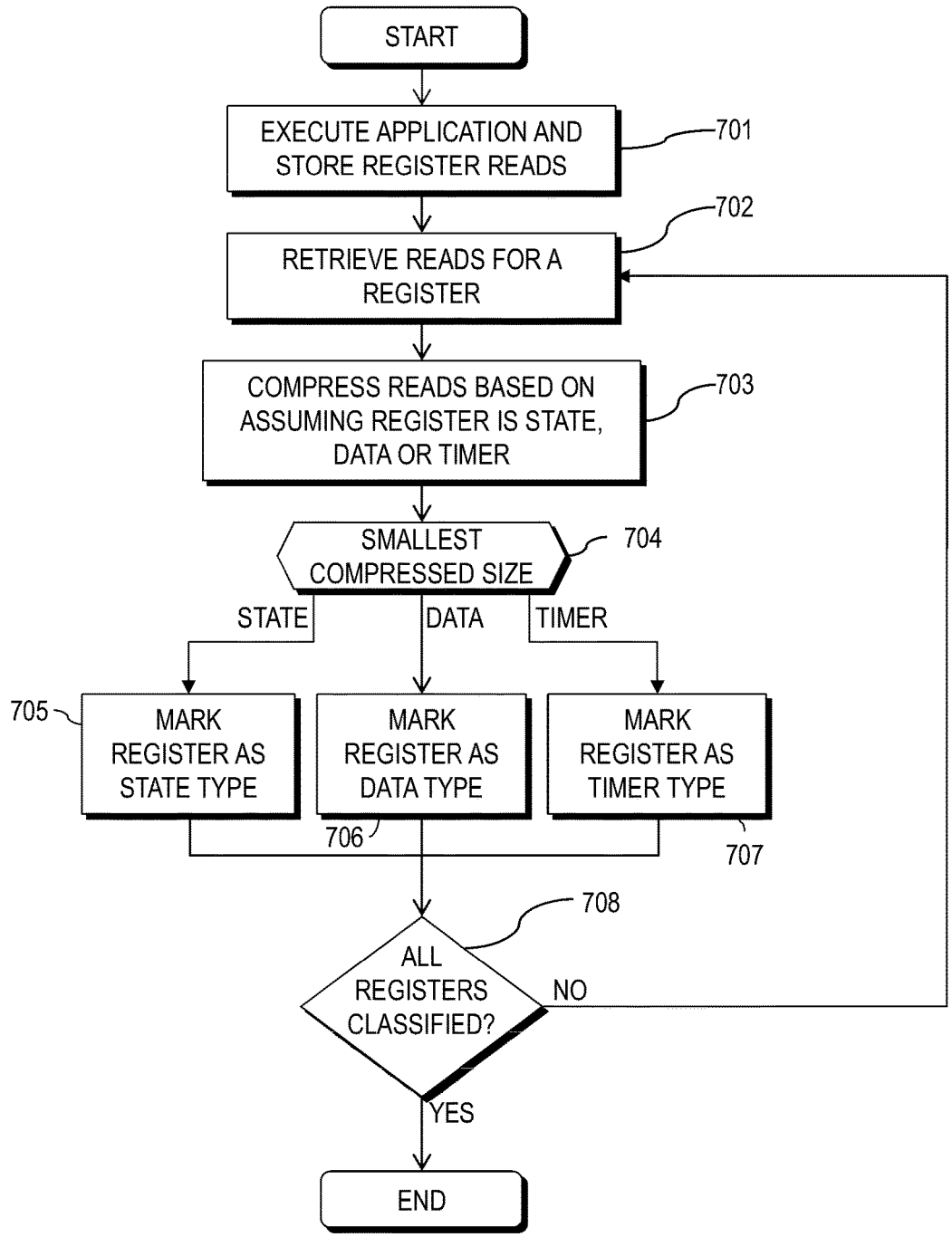
FIG. 7 is a flow diagram of exemplary methods for generating classification tables.

FIG. 7 shows one exemplary method for automatically generating the classification table. This method is based on recording a trace of a test application and then testing different methods of compression for each peripheral register. The method of compression that performs the best on the test application can also perform well on a target application. In the method depicted in FIG. 7, first, an application is executed on an instance of the target processor type, as depicted in step 701. The execution may be performed on an in-circuit emulator or a computer emulation of the target processor. During execution of the application the value of all reads from peripheral registers are stored. Then, all of the stored reads for a single peripheral register are retrieved, as depicted in step 702. The peripheral register reads are compressed, e.g., in three different ways as depicted in step 703, first, assuming the register is of type STATE, then of type DATA and finally of type TIMER. Of the three compressed versions of the register reads, the smallest one is chosen, as depicted in decision step 704. The register is then marked with the corresponding type in a table, as depicted in steps 705, 706, 707. This procedure continues until all of the registers have been classified, as depicted in decision step 708.

According to various aspects, a method for tracing program execution on a processor, e.g., an embedded processor, of a class of processors in an embedded device includes automatically performing the following steps using a processor, e.g., on a personal computer running a compiler: identifying a plurality of non-deterministic locations in the program where associated non-deterministic data are read from associated NDRs; identifying a plurality of interrupt locations in the program where interrupts occur; instrumenting the program to record register values in the associated NDRs at each of the identified plurality of non-deterministic locations into an uncompressed dataset; instrumenting the program to record interrupt occurrence of each interrupt and parameters associated with the interrupt into the uncompressed dataset; and compressing the uncompressed dataset into a compressed dataset. Various embodiments include communicating the compressed dataset to a base station.

An exemplary method for replaying program execution on a processor of a class of processors in an embedded device comprises automatically performing the following steps using a processor, e.g., in a base station or personal computer: receiving a compressed dataset at a base station; and replaying the compressed dataset at the base station, e.g., as described herein. The identifying a plurality of non-deterministic locations can include isolating instructions associated with retrieval of register values in the associated NDRs. The isolated instructions can include one or more of read, load, add, xor, and move instructions. The instrumenting the program to record register values can include replacing an associated instruction in the program to include loading the register values in the associated NDRs into one or more temporary registers; recording the values of the one or more temporary registers into the uncompressed dataset; and inserting a substitute instruction for the replaced associated instruction using data from the one or more temporary registers.

The identifying a plurality of non-deterministic locations can include ignoring (i.e., not identifying for tracing) non-deterministic locations inside of polling loops, e.g., polling loops on NDRs. Data of the recorded register values in the associated NDRs can be compressed by ignoring masked bits.

Compressing of the uncompressed dataset can include: classifying the plurality of NDRs into three types: STATE, DATA, and TIMER, and compressing data from each type into a corresponding sub-dataset using an associated compression algorithm. The classifying the plurality of NDRs can include: executing a predefined application program on a representative processor of the class of processors; recording values from each of the plurality of NDRs of the representative processor; compressing the recorded data for each of the plurality of NDRs based on register types of STATE, DATA, and TIMER, resulting in three compressed sub-datasets; comparing the size of the three compressed sub-datasets; selecting the register type associated with the smallest size of compressed sub-dataset; and associating each of the plurality of the NDRs with the selected register type in a table, e.g., stored in a computer-readable medium. The STATE peripheral register type can be compressed using a Run Length Encoding (RLE) algorithm. The DATA peripheral registers can be compressed using a Lempel-Ziv-Welch (LZW) algorithm, e.g., a Lempel-Ziv Ross Williams (LZRW) algorithm. The TIMER peripheral registers can be compressed by delta encoding. Parameters associated with an interrupt can include interrupt vectors, which can be compressed using an RLE algorithm.

Various aspects herein advantageously provide type-specific processing of non-deterministic data, e.g., compression. There are described herein a processor and computer-readable-medium carrying program instructions to cause the processor to carry out the run-time type-specific compression of non-deterministic data. There are described herein methods for, and computer-readable media carrying program instructions for, instrumenting source code to carry out type-specific compression in the context of tracing. There are also described herein methods for, and computer-readable media carrying program instructions for, carrying out type-specific decompression in the context of tracing, permitting improved debugging of, e.g., embedded systems such as WSNs. Also described herein are systems including multiple nodes, each having one or more processors, that intercommunicate and that each trace events and compress data in a type-specific way. Various aspects compress NDR reads only, compress interrupts only, or compress both NDR reads and interrupts.

A technical effect of various aspects described herein is to improve the functioning of computers by providing debugging trace data not previously available due to power and Flash-size constraints. A technical effect of various aspects described herein is to improve the technology of wireless sensor networks, e.g., for earthquake monitoring or bridge inspection, by providing increased robustness of software running on such networks and therefore increased uptime and effectiveness of such networks to carry out the measurements for which such networks are designed and deployed. A further technical effect is to present a visual representation of internal state of an embedded device, e.g., a trace screen of a node, on an electronic display.

Figure 8:
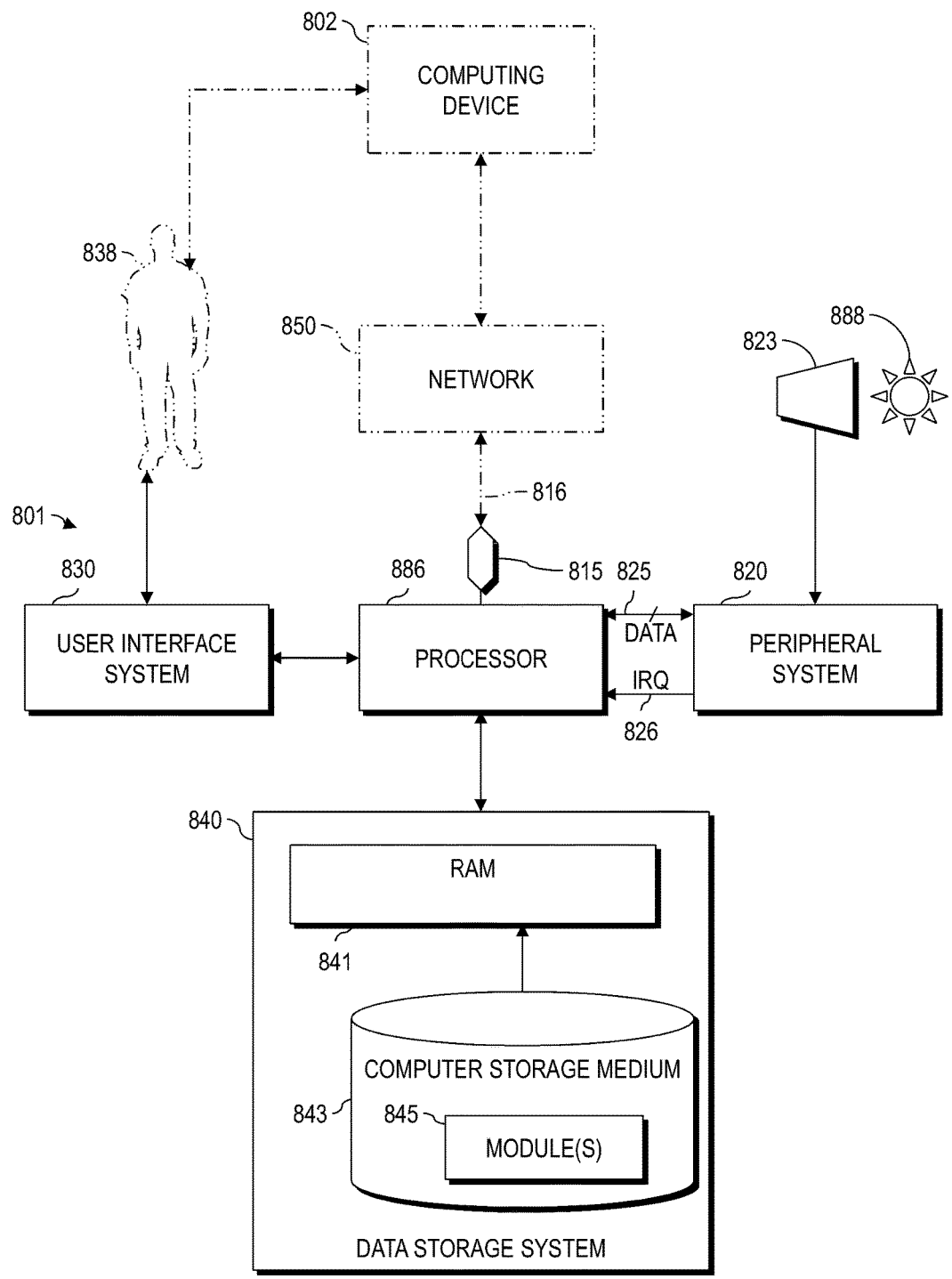
FIG. 8 is a high-level diagram showing the components of a computing device according to various aspects, and related components.

FIG. 8 is a high-level diagram showing the components of an exemplary computing device 801 and related components. The computing device 801 can be, for example, an embedded device. The computing device 801 includes a processor 886 and a data storage system 840, and can include a peripheral system 820 or a user interface system 830. The peripheral system 820, the user interface system 830 and the data storage system 840 are communicatively connected to the processor 886. Processor 886 can be communicatively connected to network 850 (shown in phantom), e.g., the Internet or a wireless sensor network, as discussed below. Devices shown in, or running code or modules shown in, FIGS. 1A-1C can each include one or more of processor 886 or systems 820, 830, 840, and can each connect to one or more network(s) 850. Processor 886, and other processing devices described herein, can each include one or more central processing units (CPU), microcontrollers (MCU), other microprocessors, field-programmable gate arrays (FPGAs), application-specific integrated circuits (ASICs), programmable logic devices (PLDs), programmable logic arrays (PLAs), programmable array logic devices (PALs), or digital signal processors (DSPs). Processor 886 can be or include one or more device(s) for automatically operating on data, whether implemented with electrical, magnetic, or optical components.

Data storage system 840 can include or be communicatively connected with one or more processor-accessible memories configured or otherwise adapted to store information. The memories can be, e.g., within a chassis or as parts of a distributed system. The phrase "processor-accessible memory" is intended to include any data storage device to or from which processor 886 can transfer data (e.g., using appropriate components of data storage system 840 or peripheral system 820), whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs).

The phrase "communicatively connected" includes any type of connection, wired or wireless, for communicating data between devices or processors. These devices or processors can be located in physical proximity or not. For example, subsystems such as peripheral system 820, user interface system 830, and data storage system 840 are shown separately from the processor 886 but can be stored completely or partially within the processor 886.

Various aspects herein may be embodied as computer program products including computer readable program code ("program code") stored on a computer readable medium, e.g., a tangible non-transitory computer storage medium or a communication medium. A computer storage medium can include tangible storage units such as volatile memory, nonvolatile memory, or other persistent or auxiliary computer storage media, removable and non-removable computer storage media implemented in any method or technology for storage of information such as computer-readable instructions, data structures, program modules, or other data. A computer storage medium can be manufactured as is conventional for such articles, e.g., by pressing a CD-ROM or electronically writing data into a Flash memory. In contrast to computer storage media, communication media may embody computer-readable instructions, data structures, program modules, or other data in a modulated data signal, such as a carrier wave or other transmission mechanism. As defined herein, computer storage media do not include communication media. That is, computer storage media do not include communications media consisting solely of a modulated data signal, a carrier wave, or a propagated signal, per se.

In an example, data storage system 840 includes RAM 841, e.g., a static RAM or dynamic RAM, and computer storage medium 843, e.g., a hard drive, Flash memory, or other nonvolatile computer storage medium. Computer program instructions are read into RAM 841 from computer storage medium 843 or a code memory therein. The code memory can include a portion of RAM 841 or computer storage medium 843 holding the computer program instructions, e.g., as binary firmware 120. Stored in the code memory are one or more module(s) 845 configured for execution by processor 886, the one or more modules including instructions to perform functions described herein. Processor 886 executes one or more sequences of the computer program instructions loaded into RAM 841, as a result performing process steps described herein. In this way, processor 886 carries out a computer implemented process. For example, steps of methods described herein with respect to FIGS. 7 and 9-11, blocks of the flowchart illustrations or block diagrams herein such as FIGS. 1A, 1B, 1C, 8, and 12, and combinations of those, can be implemented by computer program instructions. RAM 841 can also store data, or can store only code.

The peripheral system 820 can include or be communicatively connected with one or more devices configured or otherwise adapted to provide digital content records to the processor 886 or to take action in response to processor 186. For example, the peripheral system 820 can include or be communicatively connected with digital still cameras, digital video cameras, radios or other wireless communication devices, environmental sensors, or other data-providing devices. The processor 886, upon receipt of digital content records from a device in the peripheral system 820, can store such digital content records in the data storage system 840.

In the illustrated example, peripheral system 820 includes or is communicatively connected with a sensor 823. Sensor 823 is configured to monitor a target 888, graphically represented as a sun. Target 888 can be, e.g., the Earth, space, the environment around sensor 823, a machine, a bridge or other structure, a volume through which electromagnetic radiation may pass, or any other space, object, or field that can be sensed by sensor 823. In an example, sensor 823 includes a seismic sensor configured to periodically measure vibration. In the illustrated example, peripheral system 820 receives commands from, and communicates sensor 823 data to, processor 886 via data bus 825. Peripheral system 820 interrupts processor 886 using signals provided by interrupt request (IRQ) line 826. In an example, when sensor 823 has new data available, peripheral system 820 transmits a signal (e.g., a high logic level) on IRQ line 826. Processor 886 responds to that signal by executing program instructions of a corresponding interrupt service routine (ISR). The ISR or other code executed by processor 886 in response to the interrupt can read the new data via data bus 825.

In various aspects, module(s) 845 include computer program instructions to read data from a first NDR of a first type. Module(s) 845 can also include instructions to read data from a second, different NDR of a second, different type. Each of the first type and the second type can be, e.g., a state-register type, a data-register type, a timer-register type, or any other type of NDR described herein. Module(s) 845 can also include instructions to compress the data from the first NDR using a first compression algorithm to provide first compressed data, and instructions to compress the data from the second NDR using a second, different compression algorithm to provide second compressed data. Module(s) 845 can also include instructions to store the first and second compressed data in the nonvolatile medium, e.g., computer storage medium 843. Examples of these operations are discussed herein, e.g., with reference to FIGS. 1B, 2D, 7, and 9-12.

In various examples in which data storage system 840 includes a volatile computer storage medium such as RAM 841, the one or more module(s) 845 can include instructions to store the first and second compressed data in the volatile medium, e.g., before storing the first and second compressed data in the nonvolatile medium. Module(s) 845 can also include instructions to, subsequently, await an idle condition of the processor 886. An idle condition can be detected, e.g. when a task switcher in an OS running on the processor 886 transitions to the system idle process or is about to put the processor 886 to sleep. Module(s) 845 can also include instructions to, subsequently, execute the instructions to store the first and second compressed data in the nonvolatile medium, said instructions including instructions to retrieve the first and second compressed data from the volatile medium. In this way, comparatively time- and power-consuming Flash writes can take place when the processor 886 is idle and time and power are relatively less scarce than at high-load times. Examples of this are discussed above with reference to RAM 144, FIG. 1B.

In various examples using IRQ line 826 or otherwise supporting interrupts of processor 886, module(s) 845 can also include instructions to detect occurrence of a processor interrupt. Examples of such instructions include instructions to put the processor to sleep until an interrupt wakes up the processor, and instructions to busy-wait on an interrupt-pending flag of the processor. Module(s) 845 can also include instructions to determine a vector and a return address of the processor interrupt. Module(s) 845 can also include instructions to compress the determined vector and return address using a third compression algorithm different from the first and second compression algorithms to provide third compressed data. Module(s) 845 can also include instructions to store the third compressed data in the nonvolatile medium, or to store the third compressed data in the volatile medium, await an idle condition of processor 886, and then store the third compressed data in the nonvolatile medium.

The user interface system 830 can convey information in either direction, or in both directions, between a user 838 and the processor 886 or other components of computing device 801 or computing device 802. The user interface system 830 can include a mouse, a keyboard, another computer (connected, e.g., via a network or a null-modem cable), or any device or combination of devices from which data is input to the processor 886. The user interface system 830 also can include a display device, a processor-accessible memory, or any device or combination of devices to which data is output by the processor 886. The user interface system 830 and the data storage system 840 can share a processor-accessible memory. In an example, computing device 801 is a wireless sensor node lacking a user interface system 830, and computing device 802 is a desktop computer configured to retrieve data from computing device 801 and present the retrieved data to user 838 via a user interface system 830 of computing device 802.

In various aspects, processor 886 includes or is connected to communication interface 815 that is coupled via network link 816 (shown in phantom) to network 850. For example, communication interface 815 can include an integrated services digital network (ISDN) terminal adapter or a modem to communicate data via a telephone line; a network interface to communicate data via a local-area network (LAN), e.g., an Ethernet LAN, or wide-area network (WAN); or a radio to communicate data via a wireless link, e.g., WIFI or GSM. Communication interface 815 sends and receives electrical, electromagnetic or optical signals that carry digital or analog data streams representing various types of information across network link 816 to network 850. Network link 816 can be connected to network 850 via a switch, gateway, hub, router, or other networking device.

In various aspects, computing device 801 can communicate, e.g., via network 850, with a computing device 802, which can include the same types of components as computing device 801 but is not required to be identical thereto. Computing devices 801, 802 are communicatively connected via the network 850. Each computing device 801, 802 can execute computer program instructions to, e.g., read sensors 823 or otherwise participate in a network of computing devices such as nodes in a wireless sensor network.

Processor 886 can send messages and receive data, including program code, through network 850, network link 816 and communication interface 815. For example, a server can store requested code for an application program (e.g., a JAVA applet) on a tangible non-volatile computer storage medium to which it is connected. The server can retrieve the code from the medium and transmit it through network 850 to communication interface 815. The received code can be executed by processor 886 as it is received, or stored in data storage system 840 for later execution. Program code may execute, e.g., entirely on processor 886, partly on processor 886 and partly on a remote computer connected to network 850, or entirely on the remote computer.

In an example, a system includes a plurality of embedded computing devices 801, 802. Each computing device 801, 802 further includes a communication interface 815 and the one or more module(s) 845 of each embedded device include instructions to transmit the respective compressed data via the respective communication interface 815. Examples of such systems include wireless sensor networks, personal area networks, mobile ad hoc networks (MANETs), mesh networks, and other examples given above.

Figure 9:
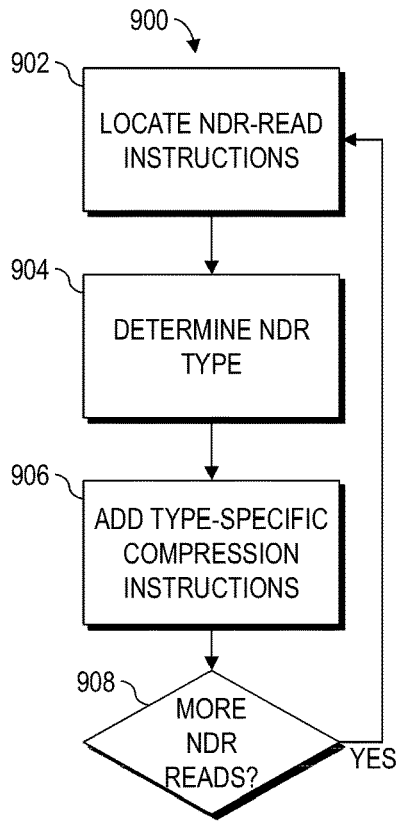
FIG. 9 is a flow diagram showing exemplary methods for enabling debug tracing in a computer program product.

FIG. 9 shows a flowchart illustrating an exemplary method 900 for enabling debug tracing in a computer program product. The computer program product, e.g., application code 104, FIG. 1, includes instructions, e.g., source, intermediate, or object code, for use within an architecture of an embedded device. The steps can be performed in any order except when otherwise specified, or when data from an earlier step is used in a later step. In at least one example, processing begins with step 902. For clarity of explanation, reference is herein made to various components shown in FIGS. 1 and 8 that can carry out or participate in the steps of the exemplary method. It should be noted, however, that other components can be used; that is, exemplary method(s) shown in FIG. 9 are not limited to being carried out by the identified components. Method 900 can be carried out, e.g., by processor 886.

An "architecture" of an embedded device defines at least some registers or storage locations of that device or devices of the same type. An architecture can also define at least some instructions that operate on those registers or storage locations. Exemplary architectures include the TI MSP430, ARM ARM7 and ARM8, INTEL x86, and AMD AMD64 ("x64").

In step 902, one(s) of the instructions are located that read an NDR. The locating is performed using register data of the architecture. This can be, e.g., as described above with reference to compiler 112 and FIGS. 2C and 2D. In the example of FIG. 2D, the "D.103" assignment is an instruction that reads an NDR and that is located.

In step 904, a register type of the NDR is determined using the register data. In the example of FIG. 2D, address reference 222 corresponds to the memory-mapped I/O port at address 28. The register data of the architecture can include a table indicating that address 28, bit 2 (mask 224) is a state register.

In step 906, instruction(s) are added to the computer program product following the located instruction(s). The added instruction(s) including instruction(s) for use within the architecture to compress the value read by the located instruction(s) using a compression algorithm corresponding to the determined register type. In the example of FIG. 2D, the call to record function 242 (or contents thereof, if inlining) are added instruction(s).

In decision step 908, it is determined whether there are any more NDR reads in the computer program product, e.g., application code 104. If so, the next step is step 902. In this way, the locating step 902, the determining step 904, and the adding step 906 are repeated for each of a plurality of located one(s) of the instructions of the computer program product using compression algorithms corresponding to the respective determined register types.

Figure 10:
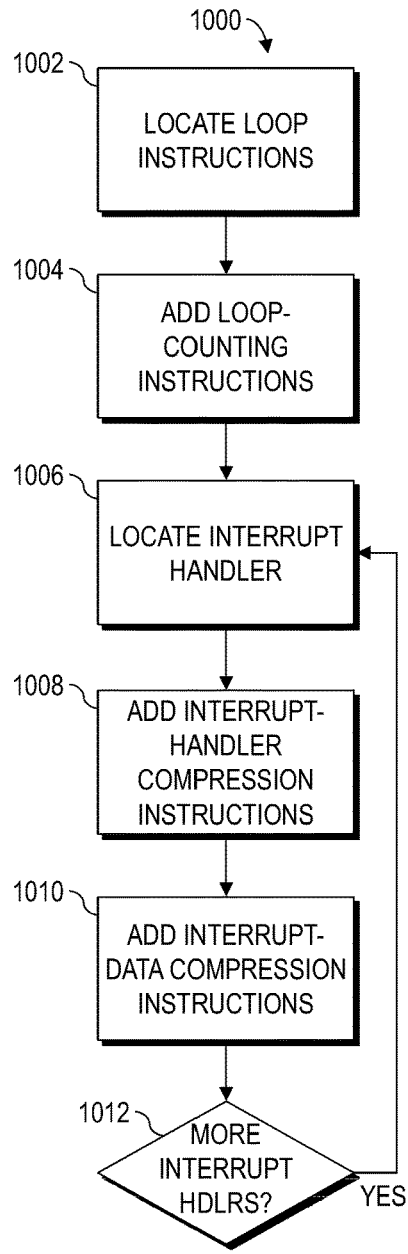
FIG. 10 is a flow diagram showing exemplary methods for enabling debug tracing in a computer program product.

FIG. 10 shows a flowchart illustrating an exemplary method 1000 for enabling debug tracing in a computer program product. Method 1000 can be carried out, e.g., by processor 886.

In step 1002, instructions of the computer program product corresponding to loops are located. This can be, e.g., as discussed above with respect to the IFG polling loop.

In step 1004, instructions(s) are added to the computer program product within the located loop. The added instructions(s) include instructions to increment a loop counter on each iteration of the loop. In an example expressed (without limitation) in the C programming language:

```
while (condition) {
    /* some code */ ;
}
``` can be rewritten as

```
while (condition) {
    /* some code */ ;
    ++loop_counter ;
}
``` where "++" is an increment operator in the C programming language.

In step 1006, at least some of the instructions of the computer program product corresponding to an interrupt handler are located. For example, the contents of an interrupt vector table in application code 104 can be inspected and routines indicated therein selected for processing.

In step 1008, instruction(s) are added to the computer program product within the located interrupt handler. The added instruction(s) can include instructions for use within the architecture to compress a vector of the interrupt, a return address of the interrupt, and a current value of the loop counter using an interrupt-data compression algorithm to provide compressed interrupt data. Exemplary compression techniques are described above.

In step 1010, instruction(s) are added to the computer program product outside the located interrupt handler. The added instruction(s) including instructions for use within the architecture to store the compressed interrupt data on a non-volatile computer-readable medium. For example, the added instruction(s) can periodically execute and can check a buffer for new interrupt data, then compress such data if present.

In decision step 1012, it is determined whether additional interrupt handler(s) are present in the computer program product. If so, steps 1006, 1008, and 1010 can be repeated for one or more of the additional interrupt handler(s).

In various examples, the added instruction(s) for a data register type include instructions to compress at least part of the value read by the located instruction using a dictionary-based compression technique. In at least one aspect, no bit's value is stored unless that bit's value is required to accurately replay the execution or otherwise influences the execution of application program 104. In various examples, the added instruction(s) for a state register type include instructions to compress at least part of the value read by the located instruction using a run-length-encoding compression technique. In various examples, the added instruction(s) for a timer register type include instructions to compress at least part of the value read by the located instruction using a delta-encoding compression technique.

Figure 11:
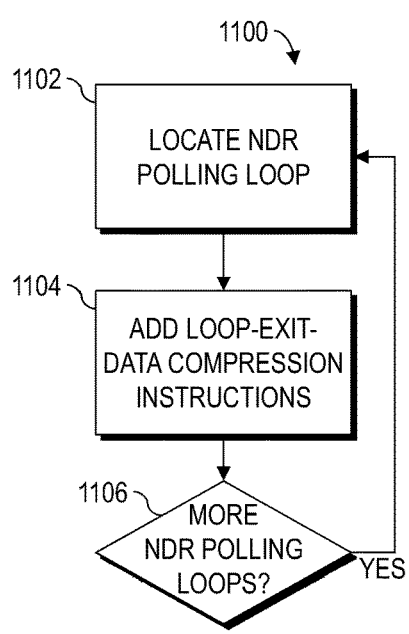
FIG. 11 is a flow diagram showing exemplary methods for enabling debug tracing in a computer program product.

FIG. 11 shows a flowchart illustrating an exemplary method 1100 for enabling debug tracing in a computer program product. Method 1100 can be carried out, e.g., by processor 886.

In step 1102, at least some of the instructions corresponding to a polling loop on an NDR are located. Polling loops on an NDR include an NDR in their loop condition (e.g., IFG in the example below). Polling loops for the purpose of step 1102 in at least one example do not modify any variables that will affect the execution sequence. For example, a polling loop can modify any number of variables as long as those variables are not used after termination of the loop.

In step 1104, instruction(s) are added to the computer program product following the located polling loop, the added instruction(s) including instructions for use within the architecture to compress information regarding exit of the polling loop and to store the compressed information on a non-volatile computer-readable medium. For example,

```
while (IFG & TXFLG) /* do nothing */ ;
``` can be rewritten as

```
while (IFG & TXFLG) /* do nothing */ ;
tardis_record_loop_exit( );
``` with suitable parameters to the tardis_record_loop_exit ( ) function call. Given the conditions above in step 1102, instruction(s) to record NDR reads (e.g., tardis_rle_record) are not added within the polling loop. This can be because the eventual result of the polling loop is deterministic, even if the time the loop takes to complete is not deterministic. In the example above, the value of IFG & TXFLG will not change until the loop exits, so leaving NDR reads in the polling loop unrecorded reduces the amount of data to be compressed. Instructions can be added within the polling loop to increment a loop counter, e.g., as described above with reference to step 1004. In at least one example, step 906 is not performed for any NDR read within a polling loop located by step 1102. In at least one example, step 902 does not locate NDR-read instructions within polling loops located by step 1102.

In step 1106, it is determined whether any NDR polling loops remain to be processed. If so, the next step is step 1102. In this way, steps 1102, 1104 can be repeated for each of a plurality of NDR polling loops in the computer program product.

Methods described in FIGS. 9, 10, and 11 can be used in any combination or arrangement. For example, compiler 112 can implement steps in FIG. 9 only, FIG. 10 only, FIG. 11 only, FIGS. 9 and 10, FIGS. 9 and 11, FIGS. 10 and 11, or FIGS. 9, 10, and 11. In examples using FIGS. 9 and 11, step 902 does not include locating NDR read instructions in polling loops (step 1102), or step 906 does not include adding tracing instructions to such reads.

Figure 12:
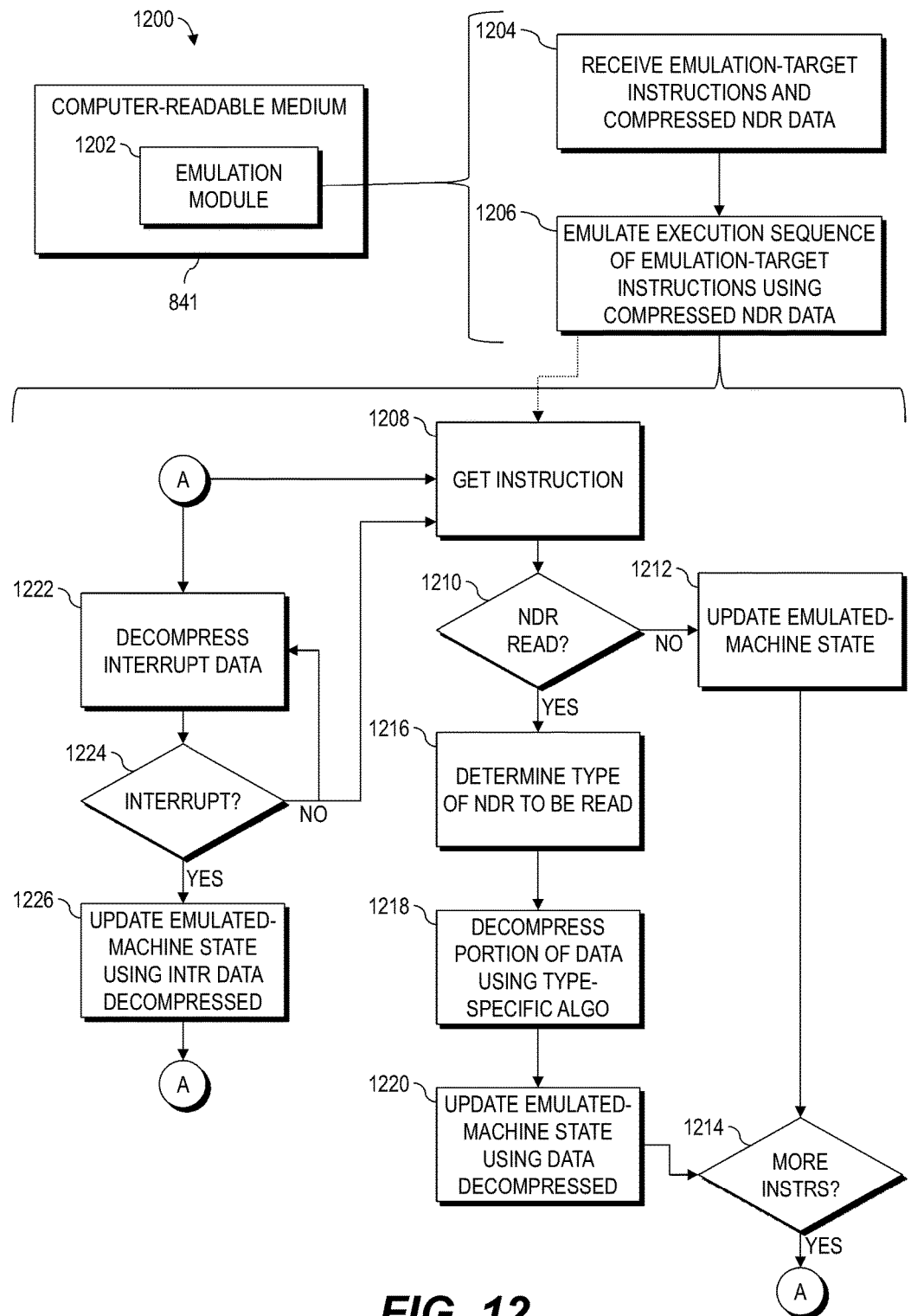
FIG. 12 is a structural and flow diagram of an exemplary computer program product including an emulator control program mechanism.

FIG. 12 illustrates an exemplary computer program product 1200 comprising a computer readable medium, e.g., in data storage system 840, such as a non-transitory, tangible computer readable storage medium 843. Product 1200 also includes an emulator computer program mechanism, e.g., the illustrated emulation module 1202 embedded therein. The emulator computer program mechanism comprises instructions for performing various functions described herein. Emulation module 1202 can include, e.g., instructions to perform functions described above with respect to FIG. 1C. Throughout the following discussion, references to functions performed by blocks of emulation module 1202 also refer to computer program instructions executable by a processor to cause those functions to be performed.

At block 1204, emulation-target instructions and compressed data of NDR values are received, e.g., by processor 886 or another processor. The emulation-target instructions include first instructions to read NDRs and second instructions, e.g., instructions that do not read NDRs or that do not read NDRs of interest. In an example, the emulated-target instructions are instructions of application code 104 or a compiled version thereof. In some aspects, block 1204 of the emulator computer program mechanism includes instructions for receiving the compressed data of NDR values via a communications link, e.g., from WSN node(s). This can permit near-real-time inspection and debugging of system performance.

At block 1206, an execution sequence of the emulation-target instructions is emulated. The execution sequence is determined at least partly by the emulated-target instructions and at least partly by the data of the NDR values. Block 1206 can include blocks 1208-1226.

At block 1208, a next instruction in the execution sequence is retrieved. This can be done by, e.g., fetching the instruction in emulated memory corresponding to an emulated program counter (PC) or instruction pointer (IP).

At decision block 1210, it is determined whether the retrieved next instruction is a first instruction that reads an NDR or a second instruction. For first instructions, the next block is block 1216. For second instructions, the next block is block 1212.

At block 1212, an emulated-machine state is updated based on the retrieved next instruction. This can include updating emulated registers or emulated memory, taking input, providing output, or otherwise performing actions the emulation target would perform as a result of executing the next instruction. Block 1212 can include changing the instruction pointer so that the execution sequence changes.

At decision block 1214, it is determined whether there are more instructions to be emulated. If so, the next block is block 1208. Using block 1208, decision block 1210, block 1212, and decision block 1214, the emulated-machine state can be updated for each second instruction in the execution sequence.

At block 1216, the next instruction retrieved by block 1208 is a first instruction. A type of the NDR read by the next instruction is determined. This can be done using register data of the architecture of the emulation target, e.g., as discussed above with reference to step 904. In some aspects, the respective type of each NDR is a state-register type, a data-register type, or a timer-register type.

At block 1218, a portion of the compressed data is decompressed using a decompression algorithm corresponding to the determined register type. In the example above using IFG, the appropriate portion of the compressed data corresponding to the traced value of IFG can be decompressed. Other examples of decompression useful in block 1218 are discussed above.

At block 1220, the emulated-machine state is updated based on the decompressed portion or based on the decompressed portion and the next instruction, as necessary depending on the next instruction. Any of the state changes discussed above with reference to block 1212 can be used.

Block 1220 is followed by decision block 1214. Using block 1208, decision block 1210, block 1216, block 1218, block 1220, and decision block 1214, the emulated-machine state can be updated for each first instruction in the execution sequence. Using blocks 1212 and 1220 and other blocks noted above in conjunction, the full execution sequence of the emulation-target instructions can be emulated.

In various aspects, the emulator computer program mechanism (e.g., emulation module 1202) further comprises instructions to process interrupt data. These instructions can be used in conjunction with or instead of the above-described blocks 1208-1214 or any subset thereof.

At block 1222, compressed data of interrupts are decompressed, in part or wholly, using an interrupt-data decompression algorithm to provide interrupt data. The interrupt-data decompression algorithm can be different from data decompression algorithm(s) used in block 1218.

At decision block 1224, it is determined whether the execution sequence has reached a point at which an interrupt occurred. This can be done by, e.g., comparing a loop counter in the emulated-machine state or in the emulation module 1202 to a loop counter in the decompressed interrupt data. If not, emulation can continue with block 1208 or block 1222. If so, emulation can continue with block 1226.

At block 1226, the emulated-machine state is updated according to the interrupt data. Using block 1222, decision block 1224, and block 1226, the emulated-machine state can be updated at point(s) in the execution sequence indicated by the interrupt data. In this way, the emulator control program mechanism can effectively emulate non-deterministic interrupts, e.g., corresponding to receipt of messages from other nodes in a WSN. Block 1226 can be followed by block 1208 or block 1222.

Figure 13:
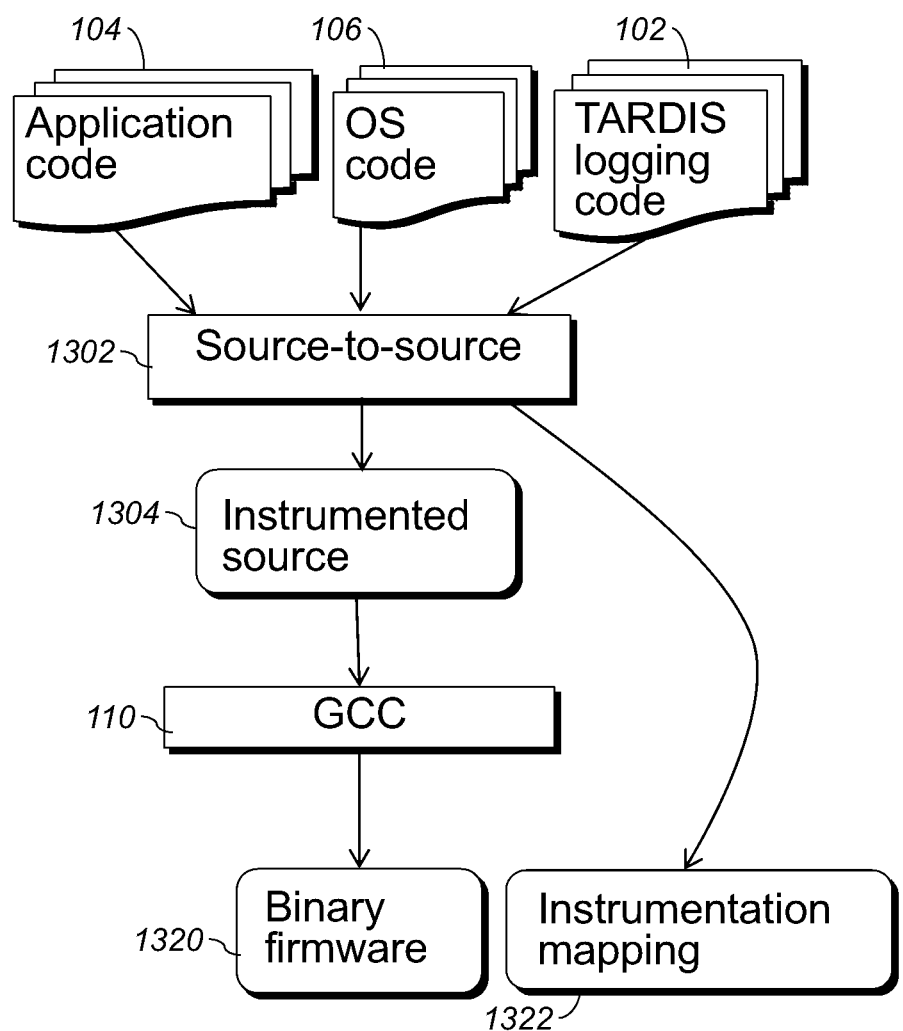
FIG. 13 is a flow diagram of exemplary processes of preparing binary firmware and a record instrumentation map.

FIG. 13 is a flow diagram of exemplary processes of preparing binary firmware and a record instrumentation map. Processes described herein with reference to FIG. 13 can be used in any context in which processes described herein with reference to FIG. 1A can be used. Application code 104, OS code 106, and TARDIS recording or logging code 102 are as shown in FIG. 1A. Code 102, 104, 106 are provided to a source-to-source transformer 1302 ("TARDIS CIL"). (CIL) [25]. Transformer 1302 identifies instructions that read from NDRs and instruments them, producing instrumented source code 1304 as one of its outputs, e.g., in the form of a C-language source code file. The instrumented source code 1304 can include only constructs valid in a particular programming language, e.g., ISO C11 as documented in ISO/IEC 9899:2011. Transformer 1302 also produces instrumentation map 1322 that includes the location of each instrumented instruction and the type of encoding or compression applied to the logged value. Instrumentation map 1322 is similar to instrumentation map 122, FIG. 1, but in at least one example includes source-level locations rather than intermediate- or machine-level locations. A compiler 110, e.g., GCC, then compiles the instrumented source code 1304 into binary firmware 1320 to be installed as firmware on the sensor node, e.g., as discussed above with reference to binary firmware 120 (FIG. 1A).

At runtime, the record code in binary firmware 1320 logs events, e.g., values read from NDRs such as peripheral registers, polling loops, or interrupts. At replay time, the emulator uses the instrumentation map 1322 to decide which instructions access peripheral registers and thus need to be fed from the log, and to determine how to decode the items in that log.

In various examples, transformer 1302 can include computer program instructions or other structures to instrument interrupt handlers to record the interrupt handler's vector along with the return address and loop count at the point when an interrupt is executed. Transformer 1302 can also or alternatively instrument the application code 104 to record the timing of interrupts using a hardware based performance counter to count the number of branches. Transformer 1302 can instrument one or more (up to all) loop bodies in the code to include an increment instruction on a global loop counter.

This application is inclusive of combinations of the aspects described herein. References to "a particular aspect" (or "embodiment" or "version") and the like refer to features that are present in at least one aspect. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. An embedded device comprising:
   a processor;
   a nonvolatile computer storage medium;
   a code memory; and
   one or more module(s) stored in the code memory and configured for execution by the processor, the one or more module(s) including instructions to:
      read first data from a first non-deterministic register (NDR) of a first type, wherein the first data is determined at least partly by influences outside the control of the embedded device;
      read second data from a second, different NDR of a second, different type, wherein the second data is determined at least partly by influences outside the control of the embedded device;
compress the first data from the first NDR using a first compression algorithm to provide first compressed data;
compress the second data from the second NDR using a second, different compression algorithm to provide second compressed data;
detect occurrence of a processor interrupt;
determine a vector and a return address of the processor interrupt;
compress the determined vector and return address using a third compression algorithm different from the first and second compression algorithms to provide third compressed data; and
store the first, second, and third compressed data in the nonvolatile medium.

2. The embedded device according to claim 1, wherein:
the device further includes a volatile computer storage medium; and
the one or more module(s) include instructions to, before storing the first compressed data and the second compressed data in the nonvolatile medium:
store the first and second compressed data in the volatile medium;
subsequently, await an idle condition of the processor; and
subsequently, retrieve the first and second compressed data from the volatile medium.

3. The embedded device according to claim 1, wherein each of the first type and the second type is selected from the group consisting of a state-register type, a data-register type, and a timer-register type.

4. The embedded device according to claim 1, wherein:
the embedded device further comprises a peripheral device communicatively connected with the processor;
the peripheral device is selected from the group consisting of:
a sensor configured to monitor a target; and
a radio; and
the peripheral is configured to provide data to the processor via at least one of the first NDR or the second NDR.

5. A system comprising a plurality of embedded devices, each embedded device comprising:
a processor;
a nonvolatile computer storage medium;
a code memory;
a communication interface; and
one or more module(s) stored in the code memory and configured for execution by the processor, the one or more module(s) including instructions to:
read first data from a first non-deterministic register (NDR) of a first type, wherein the first data is determined at least partly by influences outside the control of the respective embedded device;
read second data from a second, different NDR of a second, different type, wherein the second data is determined at least partly by influences outside the control of the respective embedded device;
compress the first data from the first NDR using a first compression algorithm to provide first compressed data;
compress the second data from the second NDR using a second, different compression algorithm to provide second compressed data;
detect occurrence of a processor interrupt;
determine a vector and a return address of the processor interrupt;
compress the determined vector and return address using a third compression algorithm different from the first and second compression algorithms to provide third compressed data;
store the first, second, and third compressed data in the nonvolatile computer storage medium; and
transmit the first, second, and third compressed data via the communication interface.

6. The embedded device according to claim 5, wherein:
the embedded device further comprises a peripheral device communicatively connected with the processor;
the peripheral device is selected from the group consisting of:
a sensor configured to monitor a target; and
a radio; and
the peripheral is configured to provide data to the processor via at least one of the first NDR or the second NDR.

7. The system according to claim 5, wherein:
each embedded device further includes a volatile computer storage medium; and
the one or more module(s) stored in the respective code memory of each embedded device include instructions to, before storing the first compressed data and the second compressed data in the nonvolatile medium:
store the first and second compressed data in the volatile medium;
subsequently, await an idle condition of the processor; and
subsequently, retrieve the first and second compressed data from the volatile medium.

8. The system according to claim 5, wherein each of the first type and the second type is selected from the group consisting of a state-register type, a data-register type, and a timer-register type.

9. A method of enabling debug tracing in a computer program product, the computer program product comprising instructions for use within an architecture of an embedded device, the method including, by a processor:
locating, in the computer program product, one(s) of the instructions that read a non-deterministic register (NDR), the locating being performed using register data of the architecture, wherein the NDR is specified by the architecture as providing data determined at least partly by influences outside the control of a processor executing the computer program product;
determining a register type of the NDR using the register data;
adding instruction(s) to the computer program product following the located instruction(s), the added instruction(s) including instruction(s) for use within the architecture to compress the value read by the located instruction(s) using a compression algorithm corresponding to the determined register type; and
repeating the locating, determining, and adding steps for each of a plurality of located one(s) of the instructions of the computer program product using compression algorithms corresponding to the respective determined register types.

10. The method according to claim 9, further including:
locating instructions of the computer program product corresponding to loops;

adding instructions(s) to the computer program product within the located loop, the added instructions(s) including instructions to increment a loop counter on each iteration of the loop;

locating at least some of the instructions of the computer program product corresponding to an interrupt handler;

adding instruction(s) to the computer program product within the located interrupt handler, the added instruction(s) including instructions for use within the architecture to compress a vector of the interrupt, a return address of the interrupt, and a current value of the loop counter using an interrupt-data compression algorithm to provide compressed interrupt data; and adding instruction(s) to the computer program product outside the located interrupt handler, the added instruction(s) including instructions for use within the architecture to store the compressed interrupt data on a non-volatile computer-readable medium.

11. The method according to claim 9, wherein the added instruction(s) for a data register type include instructions to compress at least part of the value read by the located instruction using a dictionary-based compression technique.

12. The method according to claim 9, wherein the added instruction(s) for a state register type include instructions to compress at least part of the value read by the located instruction using a run-length-encoding compression technique.

13. The method according to claim 9, wherein the added instruction(s) for a timer register type include instructions to compress at least part of the value read by the located instruction using a delta-encoding compression technique.

14. The method according to claim 9, further including:
locating at least some of the instructions corresponding to a polling loop on an NDR; and
adding instruction(s) to the computer program product following the located polling loop, the added instruction(s) including instructions for use within the architecture to compress information regarding exit of the polling loop and to store the compressed information on a non-volatile computer-readable medium.

15. The method according to claim 9, wherein:
the adding instruction(s) and the repeating comprise determining a modified computer program product including the added instruction(s); and
the method further comprises compiling the modified computer program to provide at least one object file executable by a processor of the embedded device to read the NDR and compress the value read.

16. A computer program product comprising a non-transitory computer readable medium and an emulator computer program mechanism embedded therein, the emulator computer program mechanism comprising instructions that, when executed by a processor, cause the processor to perform operations comprising:
receiving emulation-target instructions and compressed data of non-deterministic register (NDR) values, wherein the emulation-target instructions include first instructions to read NDRs and include second instructions;
emulating an execution sequence of the emulation-target instructions, the emulating including:
for each second instruction in the execution sequence, updating an emulated-machine state based on that second instruction; and
for each first instruction in the execution sequence:
determining a type of the NDR read by the first instruction;
decompressing a portion of the compressed data using a decompression algorithm corresponding to the determined type of the NDR to provide decompressed data; and
updating the emulated-machine state based on the decompressed data.

17. The computer program product according to claim 16, wherein:
the operations further comprise decompressing compressed data of interrupts using an interrupt-data decompression algorithm to provide interrupt data; and
the operations further comprise updating the emulated-machine state according to the interrupt data at point(s) in the execution sequence indicated by the interrupt data.

18. The computer program product according to claim 16, wherein the respective type of each NDR is selected from the group consisting of a state-register type, a data-register type, and a timer-register type.

19. The computer program product according to claim 16, the operations further comprising receiving the compressed data of NDR values via a communications link.

* * * * *